(12) United States Patent
Shin et al.

(10) Patent No.: US 12,431,169 B2
(45) Date of Patent: Sep. 30, 2025

(54) SEMICONDUCTOR MEMORY DEVICE

(71) Applicant: Samsung Electronics Co., Ltd., Suwon-si (KR)

(72) Inventors: Han Seong Shin, Suwon-si (KR); Ki Seok Lee, Suwon-si (KR); Keun Nam Kim, Suwon-si (KR); Hui-Jung Kim, Suwon-si (KR); Chan-Sic Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 164 days.

(21) Appl. No.: 18/503,222

(22) Filed: Nov. 7, 2023

(65) Prior Publication Data
US 2024/0355362 A1  Oct. 24, 2024

(30) Foreign Application Priority Data

Apr. 19, 2023 (KR) .................. 10-2023-0051605

(51) Int. Cl.
*G11C 5/06* (2006.01)
*H10B 12/00* (2023.01)

(52) U.S. Cl.
CPC .......... *G11C 5/063* (2013.01); *H10B 12/315* (2023.02); *H10B 12/482* (2023.02); *H10B 12/485* (2023.02)

(58) Field of Classification Search
CPC .... G11C 5/063; H10B 12/315; H10B 12/482; H10B 12/485; H10B 12/0335; H10B 12/033

USPC .............................................. 365/63, 230.06
See application file for complete search history.

(56) References Cited

U.S. PATENT DOCUMENTS

| | | |
|---|---|---|
| 8,309,449 B2 | 11/2012 | Jeong et al. |
| 8,610,189 B2 | 12/2013 | Uchiyama |
| 9,627,387 B2 | 4/2017 | Jung et al. |
| 10,008,505 B2 | 6/2018 | Lee et al. |
| 10,748,909 B2 | 8/2020 | Ma et al. |
| 2009/0122611 A1* | 5/2009 | Shimizu ............ G11C 16/3454 365/185.11 |
| 2022/0085158 A1 | 3/2022 | Park |
| 2022/0173107 A1 | 6/2022 | Moon et al. |

(Continued)

FOREIGN PATENT DOCUMENTS

KR  20080061236 A  7/2008

*Primary Examiner* — Michael T Tran
(74) *Attorney, Agent, or Firm* — Wolf, Greenfield & Sacks, P.C.

(57) ABSTRACT

A semiconductor memory device includes a substrate comprising an element isolation layer, a bit line that extends on the substrate in a first direction, a cell buffer insulating layer between the bit line and the substrate and comprising an upper cell buffer insulating layer and a lower cell buffer insulating layer, a lower storage contact disposed on a plurality of sides of the bit line and comprising a semiconductor epitaxial pattern, a storage pad on the lower storage contact and connected to the lower storage contact and an information storage unit on the storage pad and connected to the storage pad, wherein the upper cell buffer insulating layer is between the lower cell buffer insulating layer and the bit line, and each of the lower cell buffer insulating layer and the upper cell buffer insulating layer comprises an upper surface and a lower surface that are opposite to each other.

20 Claims, 36 Drawing Sheets

(56) References Cited

U.S. PATENT DOCUMENTS

| | | | |
|---|---|---|---|
| 2023/0039205 A1* | 2/2023 | Jang | H10B 12/50 |
| 2024/0155833 A1* | 5/2024 | Ahn | H10B 12/0335 |
| 2025/0151265 A1* | 5/2025 | Park | H10B 12/09 |

* cited by examiner

SEMICONDUCTOR MEMORY DEVICE

CROSS-REFERENCE TO RELATED APPLICATION

This application claims the benefit of Korean Patent Application No. 10-2023-0051605, filed on Apr. 19, 2023, in the Korean Intellectual Property Office, the disclosure of which is incorporated herein in its entirety by reference.

TECHNICAL FIELD

The present disclosure relates to a semiconductor memory device and a method of manufacturing the same, and more particularly, to a semiconductor memory device including a plurality of wiring lines and buried contacts that intersect each other.

BACKGROUND

As semiconductor devices become more highly integrated, individual circuit patterns are reducing in size to implement more semiconductor devices in the same area. That is, as the degree of integration of semiconductor devices increases, design parameters for components of the semiconductor devices are reduced.

In a highly scaled semiconductor device, a process of forming a plurality of wiring lines and a plurality of buried contacts interposed between the wiring lines is becoming increasingly complicated and difficult.

SUMMARY

Aspects of the present disclosure provide a semiconductor memory device with improved reliability and performance.

However, aspects of the present disclosure are not limited to the one set forth herein. The above and other aspects of the present disclosure will become more apparent to one of ordinary skill in the art to which the present disclosure pertains by referencing the detailed description of the present disclosure given below.

According to an aspect of the present disclosure, a semiconductor memory device comprises a substrate comprising an element isolation layer, a bit line that extends on the substrate in a first direction, a cell buffer insulating layer between the bit line and the substrate and comprising an upper cell buffer insulating layer and a lower cell buffer insulating layer, a lower storage contact on a plurality of sides of the bit line and comprising a semiconductor epitaxial pattern, a storage pad on the lower storage contact and connected to the lower storage contact; and an information storage unit on the storage pad and connected to the storage pad, wherein the upper cell buffer insulating layer is disposed the lower cell buffer insulating layer and the bit line, and each of the lower cell buffer insulating layer and the upper cell buffer insulating layer comprises an upper surface and a lower surface that are opposite to each other, wherein a height from an upper surface of the lower storage contact to an upper surface of the storage pad is smaller than or equal to a height from the upper surface of the lower cell buffer insulating layer to the upper surface of the storage pad.

According to another aspect of the present disclosure, a semiconductor memory device comprises a substrate comprising an element isolation layer, a cell gate structure within the substrate and the element isolation layer and comprising a word line and a cell gate capping pattern, a fence pattern on the cell gate structure, a lower storage contact on a plurality of sides of the cell gate structure and comprising a semiconductor epitaxial pattern, a storage pad on the lower storage contact and connected to the lower storage contact; and an information storage unit on the storage pad and connected to the storage pad, wherein the cell gate capping pattern comprises an upper surface and a lower surface that are opposite to each other, a height from a lower surface of the lower storage contact to an upper surface of the storage pad is greater than a height from the upper surface of the cell gate capping pattern to the upper surface of the storage pad, and a height from an upper surface of the substrate to the upper surface of the storage pad is greater than the height from the upper surface of the cell gate capping pattern to the upper surface of the storage pad.

According to still another aspect of the present disclosure, a semiconductor memory device comprises a substrate comprising an active area defined by an element isolation layer and that extends in a first direction, wherein the active area comprises a first part and a second part on a plurality of sides of the first part, a cell gate structure within the substrate and the element isolation layer, wherein the cell gate structure extends in a second direction and is between the first part of the active area and the second part of the active area, a bit line on the substrate and the element isolation layer, wherein the bit line extends in a third direction and is connected to the first part of the active area, a cell buffer insulating layer between the bit line and the substrate and comprising an upper cell buffer insulating layer and a lower cell buffer insulating layer, a lower storage contact on a plurality of sides of the bit line, wherein the lower storage contact is connected to the second part of the active area, and wherein the lower storage contact comprises a semiconductor epitaxial pattern, a storage pad on the lower storage contact and connected to the lower storage contact, a contact silicide layer between the lower storage contact and the storage pad and a capacitor on the storage pad and connected to the storage pad, wherein the upper cell buffer insulating layer is between the lower cell buffer insulating layer and the bit line, the cell gate structure comprises a word line and a cell gate capping pattern on the word line, and each of the cell gate capping pattern and the lower cell buffer insulating layer comprises an upper surface, wherein a height from an upper surface of the substrate to an upper surface of the storage pad is greater than a height from the upper surface of the cell gate capping pattern to the upper surface of the storage pad, and wherein the height from the upper surface of the substrate to the upper surface of the storage pad is greater than a height from an upper surface of the lower storage contact to the upper surface of the storage pad.

DETAILED DESCRIPTION

Figure 1:
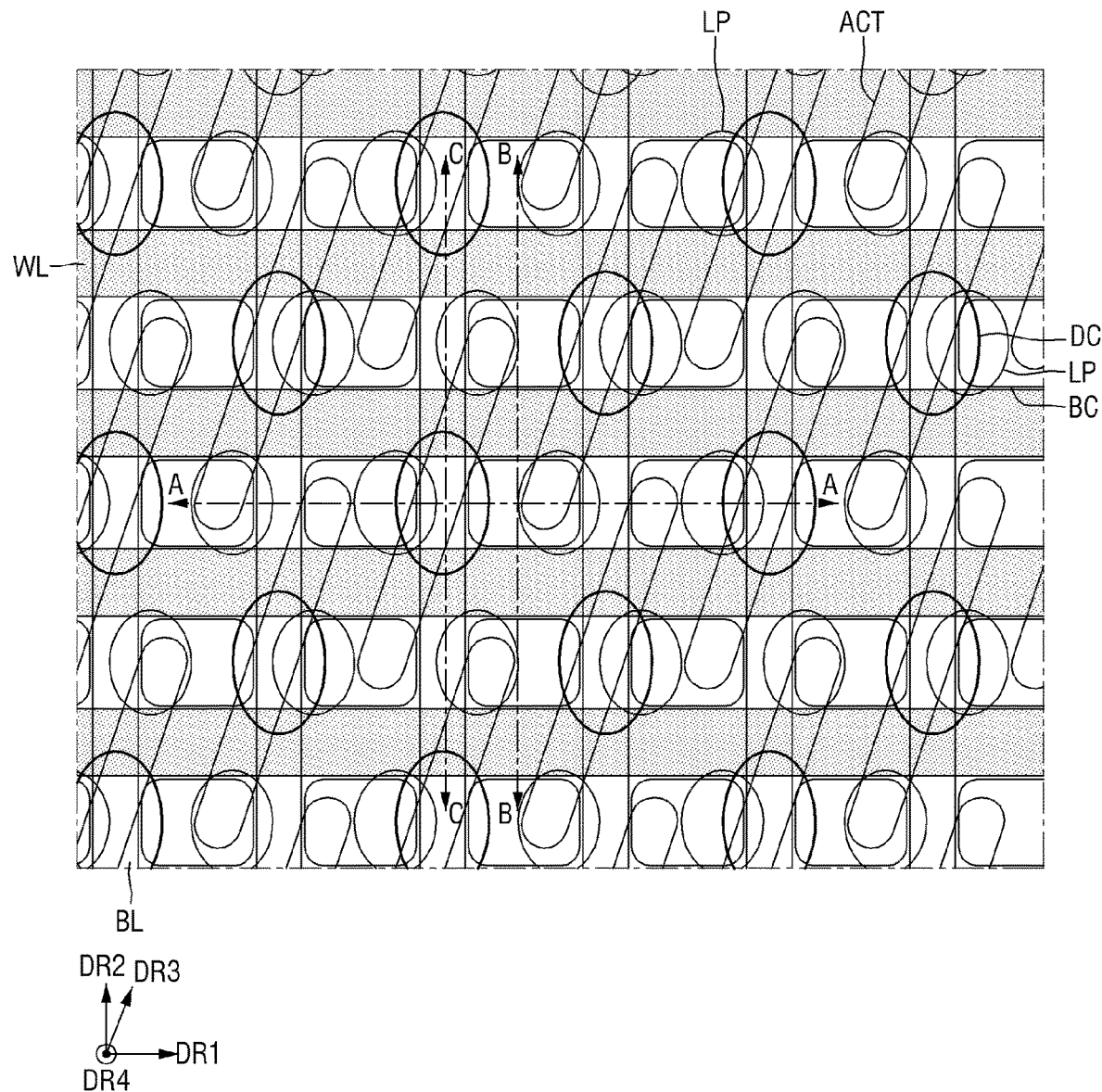
FIG. 1 is a layout of a semiconductor memory device according to embodiments of the present disclosure.

It will be understood that, although the terms first, second, third, etc., may be used herein to describe various elements or components, these elements or components should not be limited by these terms. These terms are only used to distinguish one element or component from another element or component. Thus, a first element or component discussed below could be termed a second element or component without departing from the teachings of the present disclosure.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. As used herein, "an element A is at a same level as element B" refers to at least one surface of element A that is coplanar with at least one surface of element B. The term "connected" may be used herein to refer to a physical and/or electrical connection and may refer to a direct or indirect physical and/or electrical connection.

Figure 2:
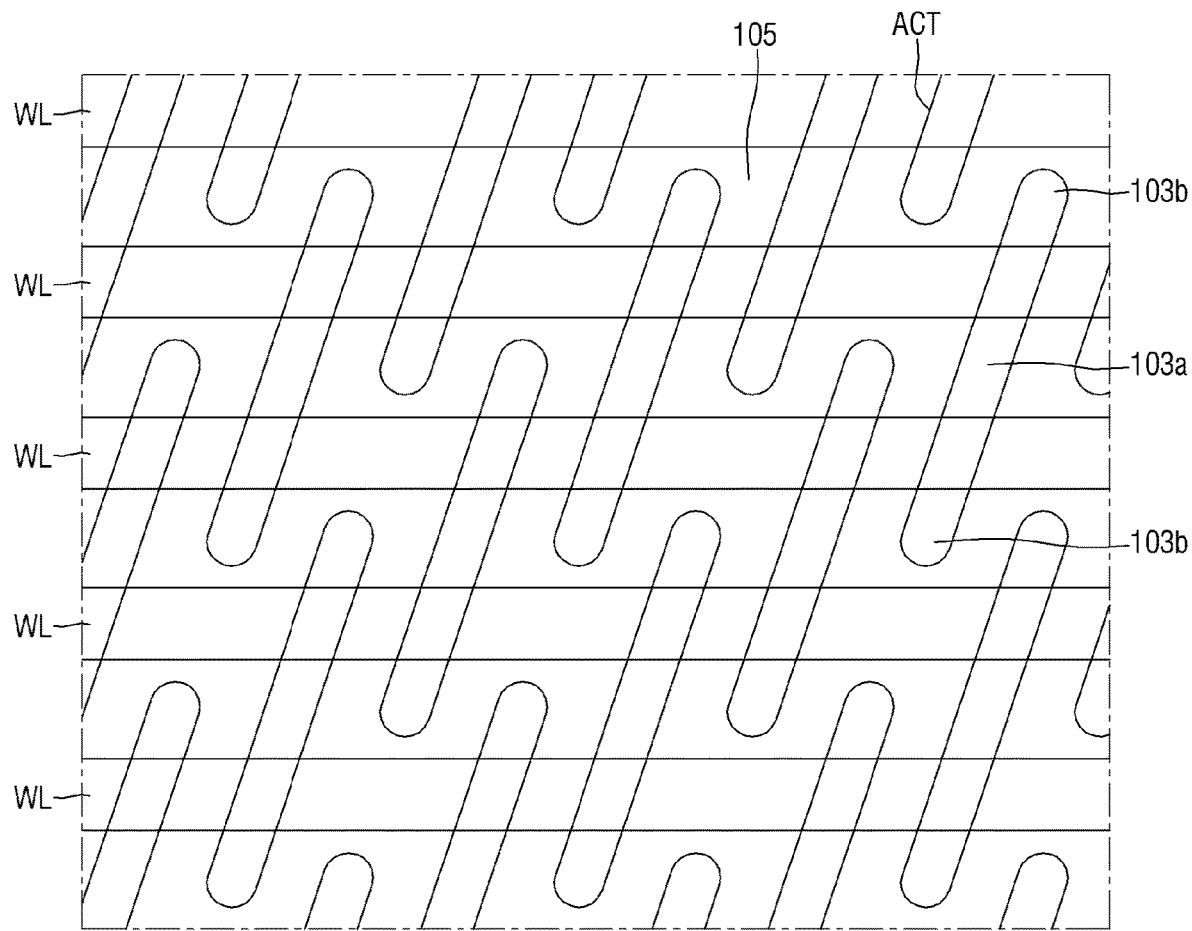
FIG. 2 is a layout showing only word lines WL and cell active areas ACT of FIG. 1.
Figure 3:
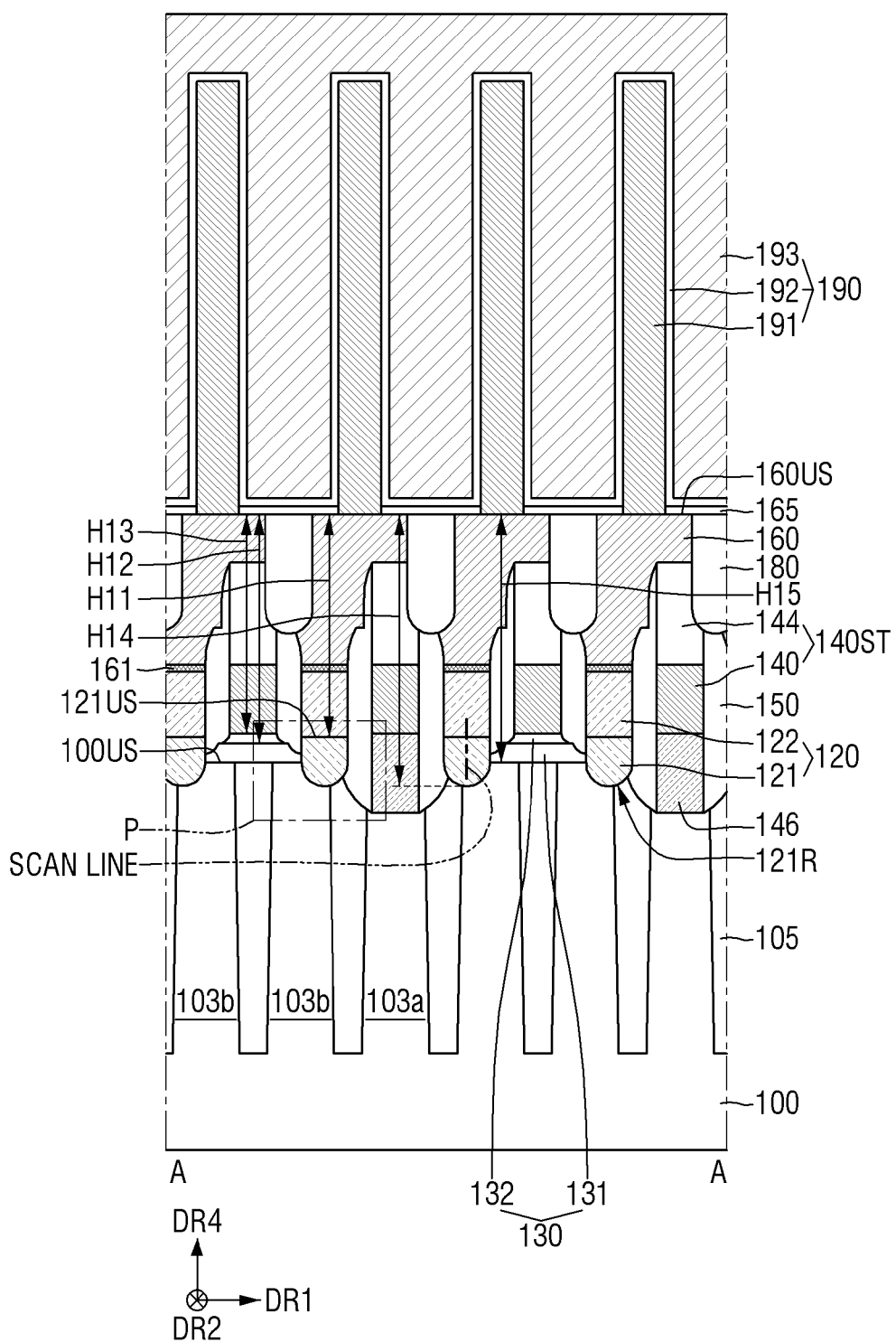
FIG. 3 is a cross-sectional view taken along line A-A of FIG. 1.
Figure 4:
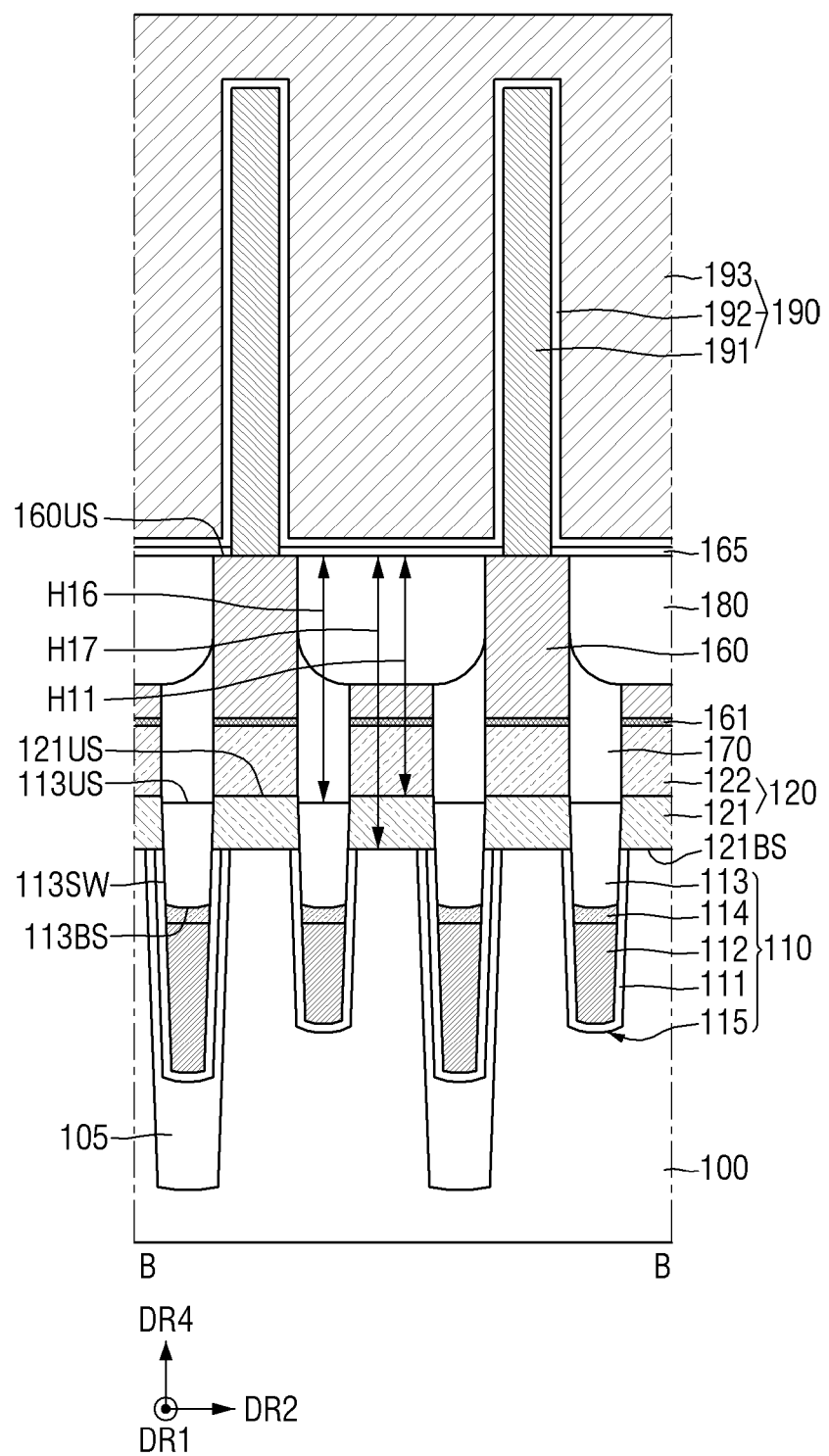
FIG. 4 is a cross-sectional view taken along line B-B of FIG. 1.
Figure 5:
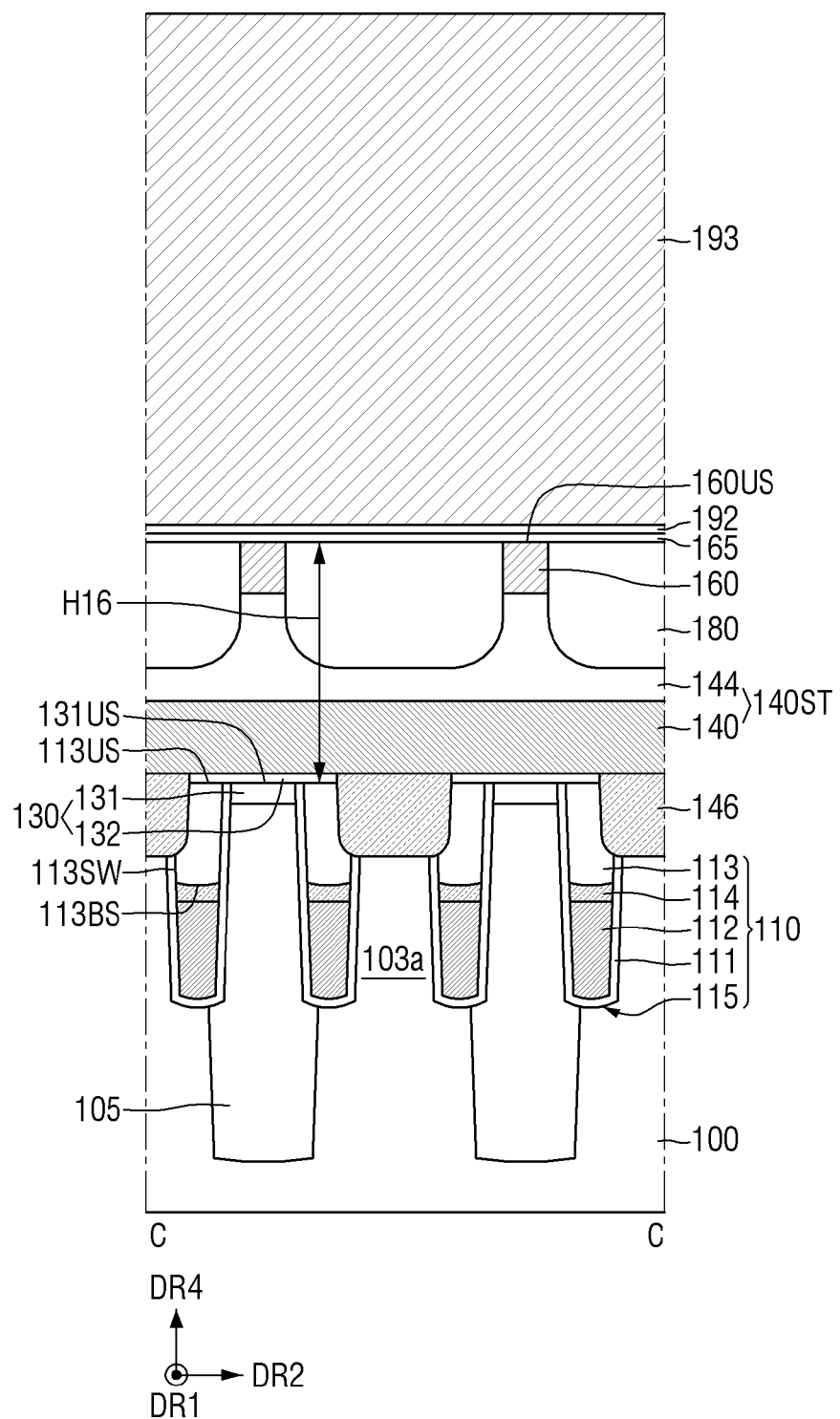
FIG. 5 is a cross-sectional view taken along line C-C of FIG. 1.
Figure 6:
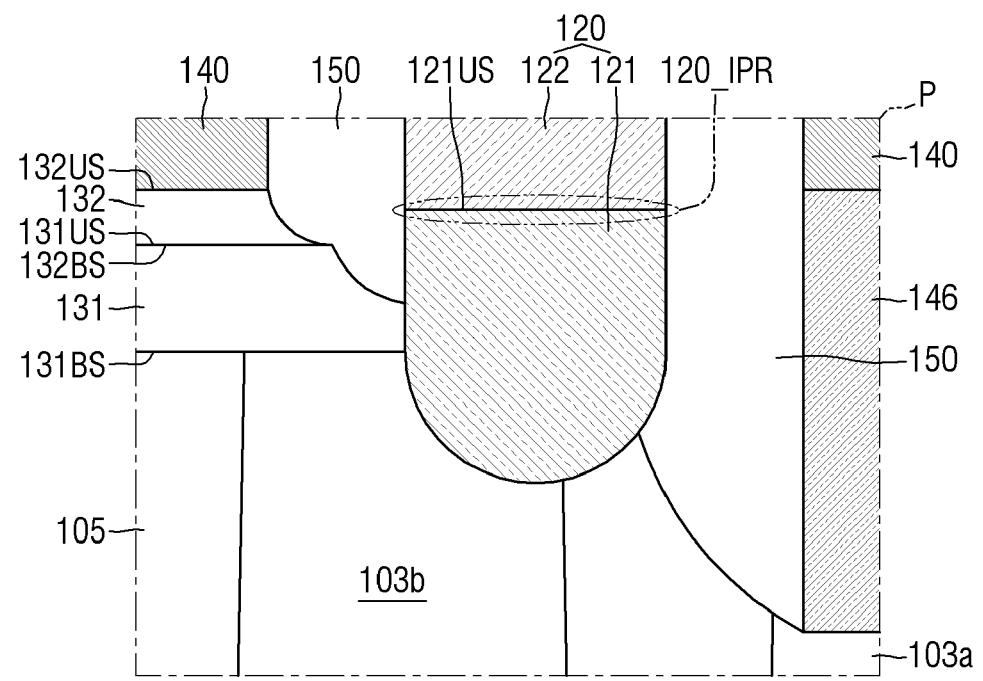
FIG. 6 is an enlarged view of portion P of FIG. 3.
Figure 7:
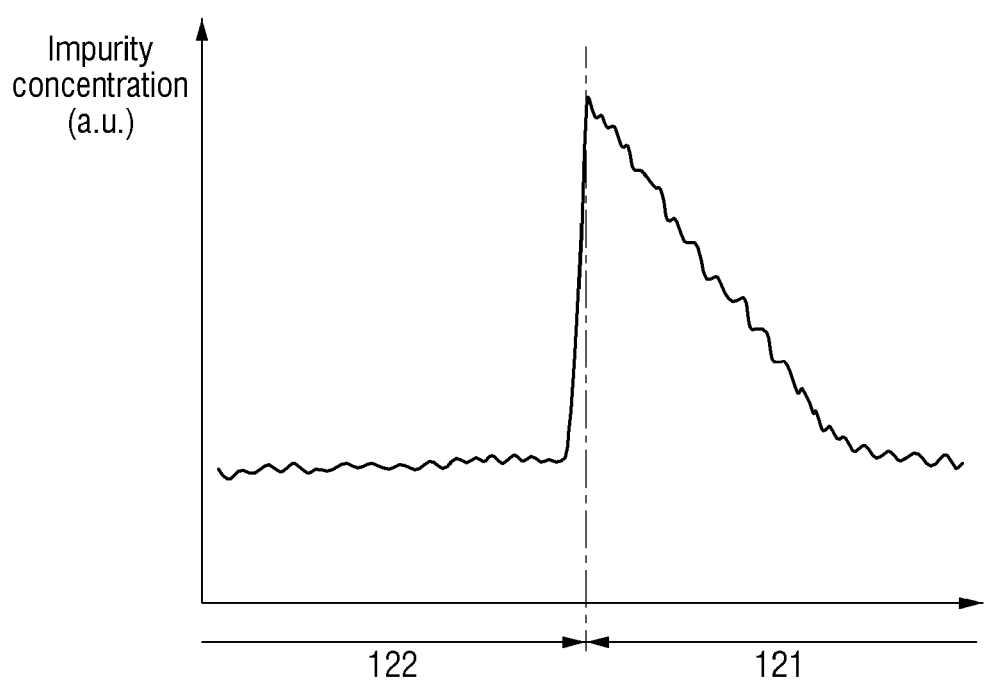
FIG. 7 is a diagram schematically illustrating impurity concentration along SCAN LINE of FIG. 3.

FIG. 1 is a layout of a semiconductor memory device according to embodiments of the present disclosure. FIG. 2 is a layout showing only word lines WL and cell active areas ACT of FIG. 1. FIG. 3 is a cross-sectional view taken along line A-A of FIG. 1. FIG. 4 is a cross-sectional view taken along line B-B of FIG. 1. FIG. 5 is a cross-sectional view taken along line C-C of FIG. 1. FIG. 6 is an enlarged view of portion P of FIG. 3. FIG. 7 is a diagram schematically illustrating impurity concentration along SCAN LINE of FIG. 3.

Although a dynamic random access memory (DRAM) is illustrated as an example in the drawings of the semiconductor memory device according to the embodiments, the present disclosure is not limited thereto.

Referring to FIGS. 1 and 2, the semiconductor memory device according to the embodiments may include a plurality of cell active areas ACT.

The cell active areas ACT may be defined by a cell element isolation layer 105 formed in a substrate 100 (see FIG. 3). As design parameters of the semiconductor memory device are reduced, the cell active areas ACT may be in the shape of diagonal or oblique bars as illustrated in the drawings. The cell active areas ACT may extend in a third direction DR3.

A plurality of gate electrodes may extend in a first direction DR1 to intersect the cell active areas ACT. The gate electrodes may extend parallel to each other. The gate electrodes may be, for example, a plurality of word lines WL. The word lines WL may be arranged at equal intervals. A width of each word line WL or a gap between the word lines WL may be determined according to the design parameters.

Each of the cell active areas ACT may be divided into three parts by two word lines WL extending in the first direction DR1. Each of the cell active areas ACT may include a storage connection part 103b and a bit line connection part 103a. The bit line connection part 103a may be at the middle of each cell active area ACT, and the storage connection part 103b may be at each end portion of the cell active area ACT.

For example, the bit line connection part 103a may be a region connected to a bit line BL, and the storage connection part 103b may be a region connected to an information storage unit 190 (see FIG. 3). In other words, the bit line connection part 103a may correspond to a common drain region, and the storage connection part 103b may correspond to a source region. Each word line WL and the bit line connection part 103a and the storage connection part 103b adjacent to the word line WL may constitute a transistor.

A plurality of bit lines BL may be on the word lines WL to extend in a second direction DR2 orthogonal to the word lines WL. The bit lines BL may extend parallel to each other. The bit lines BL may be arranged at equal intervals. A width of each bit line BL or a gap between the bit lines BL may be determined according to the design parameters.

A fourth direction DR4 may be orthogonal to the first direction DR1, the second direction DR2, and the third direction DR3. The fourth direction DR4 may be a thickness direction of the substrate 100.

The semiconductor memory device according to the embodiments may include various contact arrays formed on the cell active areas ACT. The various contact arrays may include, for example, direct contacts DC, buried contacts BC, and landing pads LP.

Here, the direct contacts DC may be contacts that electrically connect the cell active areas ACT to the bit lines BL. The buried contacts BC may be contacts that connect the cell active areas ACT to lower electrodes 191 (see FIG. 3) of the information storage unit. Due to the arrangement structure, a contact area between each buried contact BC and a cell active area ACT may be small. Accordingly, a conductive landing pad LP may be introduced to increase the contact area with the cell active area ACT and to increase a contact area with a lower electrode 191 of the information storage unit.

The landing pad LP may be between each buried contact BC and a cell active area ACT or between each buried contact BC and a lower electrode 191 of the information storage unit. In the semiconductor memory device according to the embodiments, the landing pad LP may be disposed between each buried contact BC and a lower electrode 191 of the information storage unit. The contact area increased by the introduction of the landing pad LP may reduce the contact resistance between each active area ACT and a lower electrode 191 of the information storage unit.

Each direct contact DC may be connected to the bit line connection part 103a. Each buried contact BC may be connected to the storage connection part 103b. Since the buried contacts BC are at both end portions of each cell active area ACT, the landing pads LP may be adjacent to both ends of each active area ACT to partially overlap the buried contacts BC. In other words, each buried contact BC may be formed to overlap the cell active area ACT and the cell element isolation layer 105 (see FIGS. 3 and 4) located between adjacent word lines WL and between adjacent bit lines BL.

The word lines WL may be buried in the substrate 100. The word lines WL may intersect the cell active areas ACT between the direct contacts DC or the buried contacts BC. As illustrated in the drawings, two word lines WL may intersect one cell active area ACT. Since the cell active areas ACT extend along the third direction DR3, the word lines WL may be at an angle of less than 90 degrees to the active areas ACT.

The direct contacts DC and the buried contacts BC may be arranged symmetrically. Therefore, the direct contacts DC and the buried contacts BC may lie on a straight line along the first direction DR1 and the second direction DR2. Unlike the direct contacts DC and the buried contacts BC, the landing pads LP may be arranged in a zigzag pattern in the second direction DR2 in which the bit lines BL extend. In addition, the landing pads LP may overlap the same side of each bit line BL in the first direction DR1 in which the word lines WL extend.

For example, each landing pad LP on a first line may overlap a left side of a corresponding bit line BL, and each landing pad LP on a second line may overlap a right side of the corresponding bit line BL.

Referring to FIGS. 1 through 7, the semiconductor memory device according to the embodiments may include a plurality of cell gate structures 110, a cell buffer insulating layer 130, a plurality of bit line structures 140ST, a plurality of storage contacts 120, a plurality of bit line contacts 146, and the information storage unit 190.

The substrate 100 may be a silicon substrate or silicon-on-insulator (SOI). Alternatively, the substrate 100 may include, but is not limited to, silicon germanium, silicon germanium on insulator (SGOI), indium antimonide, lead telluride, indium arsenide, indium phosphide, gallium arsenide, or gallium antimonide.

The cell element isolation layer 105 may be within the substrate 100. The cell element isolation layer 105 may have a shallow trench isolation (STI) structure having superior element isolation characteristics. The cell element isolation layer 105 may define the cell active areas ACT in a memory cell area.

The substrate 100 includes a plurality of cell active areas ACT defined by the cell element isolation layer 105. Each of the cell active areas ACT may have an elliptical shape including a short axis and a long axis as illustrated in FIGS. 1 and 2. The cell active areas ACT may be oblique at an angle of less than 90 degrees with respect to the word lines WL within the substrate 100. In addition, the cell active areas ACT may be oblique at an angle of less than 90 degrees with respect to the bit lines BL on the substrate 100.

The cell element isolation layer 105 may include, but is not limited to, at least one of a silicon oxide layer, a silicon nitride layer, and a silicon oxynitride layer.

Although the cell element isolation layer 105 is formed as one insulating layer in the drawings, this is only an example used for ease of description, and the present disclosure is not limited to this example. The cell element isolation layer 105 may be formed as one insulating layer or as a plurality of insulating layers depending on a distance between adjacent cell active areas ACT.

In FIG. 3, an upper surface of the cell element isolation layer 105 and an upper surface 100US of the substrate 100 lie on the same plane. However, this is only an example used for ease of description, and the present disclosure is not limited to this example. Due to various parameters of a manufacturing process, a height of the upper surface of the cell element isolation layer 105 from the substrate 100 shown in FIG. 3 may be different from a height of the upper surface of the cell element isolation layer 105 from the substrate 100 shown in FIG. 4.

The cell gate structures 110 may be within the substrate 100 and the cell element isolation layer 105. The cell gate structures 110 may be formed to intersect the cell element isolation layer 105 and the cell active areas ACT defined by the cell element isolation layer 105. Each of the cell gate structures 110 may include a cell gate trench 115, a cell gate insulating layer 111, a cell gate electrode 112, a cell gate capping pattern 113, and a cell gate capping conductive layer 114.

Here, the cell gate electrode 112 may correspond to a word line WL. For example, the cell gate electrode 112 may be a word line WL of FIG. 1. In one variation, each of the cell gate structures 110 may also not include the cell gate capping conductive layer 114.

The cell gate trench 115 may be relatively deep in the cell element isolation layer 105 and may be relatively shallow in each cell active area ACT. A bottom surface of each word line WL may be curved. That is, the depth of the cell gate trench 115 in the cell element isolation layer 105 may be greater than the depth of the cell gate trench 115 in each cell active area ACT.

The cell gate insulating layer 111 may extend along sidewalls and a bottom surface of the cell gate trench 115. The cell gate insulating layer 111 may extend along the profile of at least a portion of the cell gate trench 115.

The cell gate insulating layer 111 may include, for example, at least one of silicon oxide, silicon nitride, silicon oxynitride, and a high-k material having a higher dielectric constant than the silicon oxide. The high-k material may include, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. An embodiment in which the cell gate insulating layer 111 includes silicon oxide will be described below.

The cell gate electrode 112 may be formed on the cell gate insulating layer 111. The cell gate electrode 112 may fill a portion of the cell gate trench 115. The cell gate capping conductive layer 114 may extend along an upper surface of the cell gate electrode 112.

The cell gate electrode 112 may include at least one of a metal, a metal alloy, a conductive metal nitride, a conductive metal carbonitride, a conductive metal carbide, a metal silicide, a doped semiconductor material, a conductive metal oxynitride, and a conductive metal oxide. The cell gate electrode 112 may include, but is not limited to, at least one of, for example, TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and combinations thereof.

The cell gate capping conductive layer 114 may include, for example, one of polysilicon, polysilicon-germanium, amorphous silicon, and amorphous silicon-germanium, but the present disclosure is not limited thereto.

The cell gate capping pattern 113 may be on the cell gate electrode 112 and the cell gate capping conductive layer 114. The cell gate capping pattern 113 may fill a portion of the cell gate trench 115 remaining after the cell gate electrode 112 and the cell gate capping conductive layer 114 are formed.

The cell gate capping pattern 113 may include an upper surface 113US and a lower surface 113BS opposite each other in the fourth direction DR4. The lower surface 113BS of the cell gate capping pattern 113 may face the cell gate electrode 112. The upper surface 113US of the cell gate capping pattern 113 may face the information storage unit 190.

In the cross-sectional view of FIG. 4, the cell gate capping pattern 113 may include sidewalls 113SW connecting the lower surface 113BS of the cell gate capping pattern 113 and the upper surface 113US of the cell gate capping pattern 113. The cell gate insulating layer 111 may extend along the sidewalls 113SW of the cell gate capping pattern 113. For example, the cell gate insulating layer 111 may extend along a portion of the sidewalls 113SW of the cell gate capping pattern 113. The cell gate insulating layer 111 may cover a portion of the sidewalls 113SW of the cell gate capping pattern 113 and may not cover the other portion of the sidewalls 113SW of the cell gate capping pattern 113.

The cell gate capping pattern 113 may include, for example, at least one of silicon nitride (SiN), silicon oxynitride (SiON), silicon carbonitride (SiCN), silicon oxycarbonitride (SiOCN), and combinations thereof.

In FIG. 4, the cell gate capping pattern 113 may extend above the cell element isolation layer 105 in the fourth direction DR4. The cell gate capping pattern 113 may extend above the substrate 100 in the fourth direction DR4. In FIGS. 3 and 4, a height H15 from the upper surface 100US of the substrate 100 to an upper surface 160US of each storage pad 160 may be greater than a height H16 from the upper surface 113US of the cell gate capping pattern 113 to the upper surface 160US of each storage pad 160.

In one variation, an impurity doped region may be formed on at least one side of each of the cell gate structures 110. The impurity doped region may be a source/drain region of a transistor. The impurity doped region may be formed in the storage connection part 103b and the bit line connection part 103a of FIG. 2.

In FIG. 2, when a transistor including each word line WL and the bit line connection part 103a and the storage connection part 103b adjacent to the word line WL is an NMOS, the bit line connection part 103a and the storage connection part 103b may include doped n-type impurities, for example, at least one of phosphorus (P), arsenic (As), antimony (Sb), and bismuth (Bi). When a transistor including each word line WL and the bit line connection part 103a and the storage connection part 103b adjacent to the word line WL is a PMOS, the bit line connection part 103a and the storage connection part 103b may include p-type impurities, for example, at least one of boron (B) and gallium (Ga).

Each of the bit line structures 140ST may include a cell conductive line 140 and a cell line capping layer 144.

The cell conductive line 140 may be on the substrate 100 and the cell element isolation layer 105 in which the cell gate structures 110 are formed. The cell conductive line 140 may intersect the cell element isolation layer 105 and the cell active areas ACT defined by the cell element isolation layer 105. The cell conductive line 140 may intersect the cell gate structures 110. Here, the cell conductive line 140 may correspond to a bit line BL.

The cell conductive line 140 may include, for example, at least one of a semiconductor material doped with impurities, a conductive silicide compound, a conductive metal nitride, a two-dimensional (2D) material, a metal, and a metal alloy. In the semiconductor memory device according to the embodiments, the 2D material may be a metallic material and/or a semiconductor material. The 2D material may include a 2D allotrope or a 2D compound, for example, may include at least one of graphene, molybdenum disulfide ($MoS_2$), molybdenum diselenide ($MoSe_2$), tungsten diselenide ($WSe_2$), and tungsten disulfide ($WS_2$), but the present disclosure is not limited thereto. That is, since the above 2D materials are only examples, the 2D materials that can be included in the semiconductor memory device of the present disclosure are not limited to the above materials.

Although the cell conductive line 140 is illustrated as a single layer, this is only an example used for ease of description, and the present disclosure is not limited to this example. In one variation, the cell conductive line 140 may also include a plurality of conductive layers in which conductive materials are stacked.

The cell line capping layer 144 may be on the cell conductive line 140. The cell line capping layer 144 may extend in the second direction DR2 along an upper surface of the cell conductive line 140. The cell line capping layer 144 may include, for example, at least one of a silicon nitride layer, silicon oxynitride, silicon carbonitride, and silicon oxycarbonitride.

In the semiconductor memory device according to the embodiments, the cell line capping layer 144 may include a silicon nitride layer. Although the cell line capping layer 144 is illustrated as a single layer, the present disclosure is not limited thereto.

A bit line spacer 150 may be on sidewalls of the cell conductive lines 140 and the cell line capping layers 144. The bit line spacer 150 extends in the second direction DR2.

Although the bit line spacer 150 is illustrated as a single layer, this is only an example used for ease of description, and the present disclosure is not limited thereto. That is, in one variation, the bit line spacer 150 may also have a multilayer structure. The bit line spacer 150 may include, for example, one of a silicon oxide layer, a silicon nitride layer, a silicon oxynitride layer (SiON), a silicon oxycarbonitride layer (SiOCN), air, and combinations thereof, but the present disclosure is not limited thereto.

The cell buffer insulating layer 130 may be on the substrate 100 and the cell element isolation layer 105. More specifically, the cell buffer insulating layer 130 may be disposed on the upper surface 100US of the substrate and the upper surface of the cell element isolation layer 105 on which the bit line contacts 146 and the storage contacts 120 are not formed. The cell buffer insulating layer 130 may be disposed between the substrate 100 and the cell conductive lines 140 and between the cell element isolation layer 105 and the cell conductive lines 140.

The cell buffer insulating layer 130 may include a lower cell buffer insulating layer 131 and an upper cell buffer insulating layer 132. The upper cell buffer insulating layer 132 may be between the lower cell buffer insulating layer 131 and the cell conductive lines 140.

The lower cell buffer insulating layer 131 may include an upper surface 131US and a lower surface 131BS opposite each other in the fourth direction DR4. The upper cell buffer insulating layer 132 may include an upper surface 132US and a lower surface 132BS opposite each other in the fourth direction DR4. The upper surface 131US of the lower cell buffer insulating layer 131 and the upper surface 132US of the upper cell buffer insulating layer 132 may face the bit cell conductive lines 140 and the information storage unit 190.

The upper surface 131US of the lower cell buffer insulating layer 131 may contact the lower surface 132BS of the upper cell buffer insulating layer 132. The lower surface 131BS of the lower cell buffer insulating layer 131 may contact the upper surface 100US of the substrate 100 and the upper surface of the cell element isolation layer 105. In the cross-sectional view of FIG. 3, a width of the lower surface 131BS of the lower cell buffer insulating layer 131 in the first direction DR1 is greater than a width of the upper surface of the cell element isolation layer 105 in the first direction DR1.

In FIG. 5, the lower cell buffer insulating layer 131 may not be on the cell gate capping patterns 113. The lower cell buffer insulating layer 131 may not contact the upper surfaces 113US of the cell gate capping patterns 113. For example, the upper surface 131US of the lower cell buffer insulating layer 131 may lie on the same plane as the upper surfaces 113US of the cell gate capping patterns 113. A portion of each cell gate trench 115 may be within the lower cell buffer insulating layer 131.

The upper cell buffer insulating layer 132 may be on the cell gate capping patterns 113. The upper cell buffer insulating layer 132 may contact the upper surfaces 113US of the cell gate capping patterns 113.

The lower cell buffer insulating layer 131 may include, for example, a silicon oxide layer. The upper cell buffer insulating layer 132 may include, for example, a silicon nitride layer. In FIG. 5, a boundary exists between the lower cell buffer insulating layer 131 and the cell element isolation layer 105. However, the present disclosure is not limited thereto. When the cell element isolation layer 105 includes silicon oxide, there may be no boundary between the lower cell buffer insulating layer 131 and the cell element isolation layer 105 (e.g., the lower cell buffer insulating layer 131 and the cell element isolation layer 105 are monolithic).

Each of the bit line contacts 146 may be formed between a cell conductive line 140 and the substrate 100. The cell conductive lines 140 may be on the bit line contacts 146.

Each of the bit line contacts 146 may be between the bit line connection part 103a of a cell active area ACT and a cell conductive line 140. The bit line contacts 146 may electrically connect the cell conductive lines 140 and the substrate 100. Each of the bit line contacts 146 may be connected to the bit line connection part 103a.

The bit line contacts 146 may correspond to the direct contacts DC. The bit line contacts 146 may include, for example, at least one of a semiconductor material doped with impurities, a conductive metal silicide, a conductive metal nitride, a conductive metal oxide, a metal, and a metal alloy.

In a portion of the cell conductive line 140 on which the bit line contacts 146 are formed, the bit line spacer 150 may be on the substrate 100 and the cell element isolation layer 105. The bit line spacer 150 may be on the sidewalls of the cell conductive lines 140, the cell line capping layers 144, and the bit line contacts 146.

In portions of the cell conductive line 140 on which the bit line contacts 146 are not formed, the bit line spacer 150 may be on the cell buffer insulating layer 130. The bit line spacer 150 may be on the sidewalls of the cell conductive lines 140 and the cell line capping layers 144.

Fence patterns 170 may be on the substrate 100 and the cell element isolation layer 105. The fence patterns 170 may overlap the cell gate structures 110 within the substrate 100 and the cell element isolation layer 105 in the fourth direction DR4.

The fence patterns 170 may be on the cell gate structures 110. The fence patterns 170 may contact the upper surfaces 113US of the cell gate capping patterns 113.

Each of the fence patterns 170 may be between the bit line structures 140ST extending in the second direction D2. The fence patterns 170 may include, for example, at least one of silicon oxide, silicon nitride, silicon oxynitride, and combinations thereof.

Each of the storage contacts 120 may be between the cell conductive lines 140 adjacent to each other in the first direction DR1. The storage contacts 120 may be on both sides of each cell conductive line 140. Each of the storage contacts 120 may be between the bit line structures 140ST.

The storage contacts 120 may be on both sides of each of the cell gate structures 110. Each of the storage contacts 120 may be between the fence patterns 170 adjacent to each other in the second direction DR2.

Each of the storage contacts 120 may overlap the substrate 100 and the cell element isolation layer 105 between adjacent cell conductive lines 140. The storage contacts 120 may be connected to the cell active areas ACT. More specifically, each of the storage contacts 120 may be connected to the storage connection part 103b. Here, the storage contacts 120 may correspond to the buried contacts BC of FIG. 1.

Each of the storage contacts 120 may include a lower storage contact 121 and an upper storage contact 122. The upper storage contact 122 may be on the lower storage contact 121. For example, the lower storage contact 121 may be directly connected to the upper storage contact 122.

The lower storage contact 121 is directly connected to the substrate 100. The lower storage contact 121 is connected to the storage connection part 103b. A portion of the lower storage contact 121 may be within the substrate 100.

The lower storage contact 121 may be within each storage contact recess 121R. The lower storage contact 121 may fill the entire storage contact recess 121R.

For example, each storage contact recess 121R may be defined by the substrate 100, the cell element isolation layer 105, and the bit line spacer 150. Since a portion of each storage contact recess 121R is defined by the bit line spacer 150, the lower storage contact 121 may be on the bit line spacer 150. The lower storage contact 121 may contact the substrate 100, the cell element isolation layer 105, and the bit line spacer 150.

The lower storage contact 121 may contact each cell gate capping pattern 113. For example, the lower storage contact 121 may cover a portion of a sidewall 113SW of a cell gate capping pattern 113. The lower storage contact 121 may contact a portion of the sidewall 113SW of the cell gate capping pattern 113. In FIG. 4, the lower storage contact 121 may be on the cell gate insulating layer 111 and the cell element isolation layer 105.

The lower storage contact 121 may include an upper surface 121US and a lower surface 121BS opposite each other in the fourth direction DR4. The lower surface 121BS of the lower storage contact 121 may contact the substrate 100.

The upper surface 121US of the lower storage contact 121 may extend above the upper surface 100US of the substrate 100 in the fourth direction DR4. The height H15 from the upper surface 100US of the substrate 100 to the upper surface 160US of each storage pad 160 may be greater than a height H11 from the upper surface 121US of the lower storage contact 121 to the upper surface 160US of each storage pad 160.

The upper surface 121US of the lower storage contact 121 may have a height that is greater than or equal to that of the upper surface 131US of the lower cell buffer insulating layer 131 from the upper surface 100US of the substrate 100. The height H11 from the upper surface 121US of the lower storage contact 121 to the upper surface 160US of each storage pad 160 may be less than or equal to a height H12 from the upper surface 131US of the lower cell buffer insulating layer 131 to the upper surface 160US of each storage pad 160.

For example, the upper surface 121US of the lower storage contact 121 may have lower height from the upper surface 100US of the substrate 100 than the upper surface 132US of the upper cell buffer insulating layer 132. The height H11 from the upper surface 121US of the lower storage contact 121 to the upper surface 160US of each storage pad 160 may be greater than a height H13 from the upper surface 132US of the upper cell buffer insulating layer 132 to the upper surface 160US of each storage pad 160.

In one variation, the upper surface 121US of the lower storage contact 121 may have a height that is greater than or equal to that of the upper surface 132US of the upper cell buffer insulating layer 132 from the upper surface 100US of the substrate 100. The height H11 from the upper surface 121US of the lower storage contact 121 to the upper surface 160US of each storage pad 160 may be less than or equal to the height H13 from the upper surface 132US of the upper cell buffer insulating layer 132 to the upper surface 160US of each storage pad 160.

In FIGS. 3 and 4, a height H14 from the bottom of the lower storage contact 121 to the upper surface 160US of each storage pad 160 may be greater than the height H16 from the upper surface 113US of the cell gate capping pattern 113 to the upper surface 160US of each storage pad 160. The height H11 from the upper surface 121US of the lower storage contact 121 to the upper surface 160US of each storage pad 160 may be equal to or less than the height H16 from the upper surface 113US of the cell gate capping pattern 113 to the upper surface 160US of each storage pad 160. When the upper surface 113US of the cell gate capping pattern 113 is lower than the upper surface 121US of the lower storage contact 121, a fence pattern 170 may contact the lower storage contact 121. The lower storage contact 121 may contact a portion of each sidewall of the fence pattern 170.

In FIG. 4, a height H17 from the lower surface 121BS of the lower storage contact 121 to the upper surface 160US of each storage pad 160 may be greater than the height H16 from the upper surface 113US of the cell gate capping pattern 113 to the upper surface 160US of each storage pad 160.

The upper storage contact 122 may be on the lower storage contact 121. The upper storage contact 122 may be directly connected to the lower storage contact 121. The upper storage contact 122 may be connected to the upper surface 121US of the lower storage contact 121.

The bit line spacer 150 may not cover the upper surface 121US of the lower storage contact 121. The bit line spacer 150 may not extend along the upper surface 121US of the lower storage contact 121.

The lower storage contact 121 includes a semiconductor material. The lower storage contact 121 includes a semiconductor epitaxial pattern formed using an epitaxial growth method. For example, the lower storage contact 121 may include a monocrystalline semiconductor material.

The upper storage contact 122 includes a semiconductor material. The upper storage contact 122 may include one of a polycrystalline semiconductor material, an amorphous semiconductor material, and a monocrystalline semiconductor material. In the semiconductor memory device according to the embodiments of the present disclosure, the upper storage contact 122 may include a polycrystalline semiconductor material.

For example, each of the lower storage contact 121 and the upper storage contact 122 may include n-type impurities. The n-type impurity concentration of the upper storage contact 122 may be greater than the n-type impurity concentration of the lower storage contact 121.

For example, the concentration of the n-type impurities included in the lower storage contact 121 may be constant. For another example, the concentration of the n-type impurities included in the lower storage contact 121 may change as the distance from the substrate 100 increases. The concentration of the n-type impurities included in the lower storage contact 121 may increase as the distance from the substrate 100 increases, but the present disclosure is not limited thereto.

Each of the storage contacts 120 may further include an impurity pile-up region 120_IPR. The impurity pile-up region 120_IPR may be formed within each of the storage contacts 120.

The impurity pile-up region 120_IPR may be formed around a boundary surface between the upper storage contact 122 and the lower storage contact 121. The impurity pile-up region 120_IPR may be formed along the upper surface 121US of the lower storage contact 121.

The impurity pile-up region 120_IPR may be a region in which a greater amount of piled-up impurities are present relative to other regions of each storage contact 120. The impurity pile-up region 120_IPR may be a region in which the piled-up impurities are accumulated.

Referring to FIG. 7, regions other than the impurity pile-up region 120_IPR of each storage contact 120 do not necessarily refer to regions not including the piled-up impurities. The piled-up impurities may include, for example, at least one of carbon and nitrogen, but the present disclosure is not limited thereto. The piled-up impurities accumulated in the impurity pile-up region 120_IPR may include, for example, at least one of carbon and nitrogen.

In FIG. 7, the piled-up impurities may rapidly increase at the boundary between the lower storage contact 121 and the upper storage contact 122. In addition, the concentration of the piled-up impurities in the lower storage contact 121 may gradually decrease as the distance from the upper surface 121US of the lower storage contact 121 increases.

Although a boundary exists between the lower storage contact 121 and the upper storage contact 122, the present disclosure is not limited thereto. In one variation, there may be no boundary between the lower storage contact 121 and the upper storage contact 122 (e.g., the lower storage contact 121 and the upper storage contact 122 are monolithic).

However, since the impurity pile-up region 120_IPR can be identified through component analysis, the boundary surface between the lower storage contact 121 and the upper storage contact 122 can be identified through the impurity pile-up region 120_IPR.

The storage pads 160 may be on the storage contacts 120. The storage pads 160 may be on the lower storage contacts 121. The upper storage contacts 122 may be between the lower storage contacts 121 and the storage pads 160.

The storage pads 160 may be electrically connected to the storage contacts 120. For example, the storage pads 160 may be connected to the lower storage contacts 121. The storage pads 160 may be connected to the storage connection parts 103b of the cell active areas ACT. Here, the storage pads 160 may correspond to the landing pads LP.

The storage pads 160 may partially overlap upper surfaces of the bit line structures 140ST. The storage pads 160 may include, for example, at least one of a conductive metal nitride, a conductive metal carbide, a metal, and a metal alloy.

A contact silicide layer 161 may be between the storage pads 160 and the storage contacts 120. The contact silicide layer 161 may be between the storage pads 160 and the upper storage contacts 122.

For example, the contact silicide layer 161 may contact the storage pads 160 and the upper storage contacts 122. The contact silicide layer 161 may include a metal silicide compound.

A pad isolation insulating layer 180 may be on the storage pads 160 and the bit line structures 140ST. For example, the pad isolation insulating layer 180 may be on the cell line capping layers 144. The pad isolation insulating layer 180 may define the storage pads 160 that form a plurality of isolation regions. The pad isolation insulating layer 180 may not cover the upper surfaces 160US of the storage pads 160. For example, the upper surfaces 160US of the storage pads 160 may be at the same height as an upper surface of the pad isolation insulating layer 180 from the upper surface 100US of the substrate 100.

The pad isolation insulating layer 180 may include an insulating material and may electrically separate/isolate the storage pads 160 from each other. For example, the pad isolation insulating layer 180 may include, for example, at least one of a silicon oxide layer, a silicon nitride layer, a silicon oxynitride layer, a silicon oxycarbonitride layer, and a silicon carbonitride layer.

An etch stop layer 165 may be on the upper surfaces 160US of the storage pads 160 and the upper surface of the pad isolation insulating layer 180. The etch stop layer 165 may include, for example, at least one of silicon nitride (SiN), silicon carbonitride (SiCN), silicon oxycarbonitride (SiOCN), silicon oxycarbide (SiOC), and silicon boron nitride (SiBN).

The information storage unit 190 may be on the storage pads 160. The information storage unit 190 is connected to the storage pads 160. A portion of the information storage unit 190 may be within the etch stop layer 165.

The information storage unit 190 may include, for example, a capacitor, but the present disclosure is not limited thereto. The information storage unit 190 includes the lower electrodes 191, a capacitor dielectric layer 192, and an upper electrode 193. For example, the upper electrode 193 may be a plate top electrode having a plate shape.

The lower electrodes 191 may be on the storage pads 160. The lower electrodes 191 may have, for example, a pillar shape.

The capacitor dielectric layer 192 may be on the lower electrodes 191. The capacitor dielectric layer 192 may extend along the profiles of the lower electrodes 191. The upper electrode 193 may be on the capacitor dielectric layer 192. The upper electrode 193 may cover outer walls of the lower electrodes 191. Although the upper electrode 193 is illustrated as a single layer, this is only an example used for ease of description, and the present disclosure is not limited to this example.

Each of the lower electrodes 191 and the upper electrode 193 may include, for example, a doped semiconductor material, a conductive metal nitride (e.g., titanium nitride, tantalum nitride, niobium nitride or tungsten nitride), a metal (e.g., ruthenium, iridium, titanium or tantalum), and a conductive metal oxide (e.g., iridium oxide or niobium oxide), but the present disclosure is not limited thereto.

The capacitor dielectric layer 192 may include, for example, one of silicon oxide, silicon nitride, silicon oxynitride, a high-k material, and combinations thereof, but the present disclosure is not limited thereto. In the semiconductor memory device according to the embodiments, the capacitor dielectric layer 192 may include a structure in which zirconium oxide, aluminum oxide, and zirconium oxide are sequentially stacked. In the semiconductor memory device according to the embodiments, the capacitor dielectric layer 192 may include a dielectric layer including hafnium (Hf). In the semiconductor memory device according to the embodiments, the capacitor dielectric layer 192 may have a stacked structure of a ferroelectric material layer and a paraelectric material layer.

Figure 8:
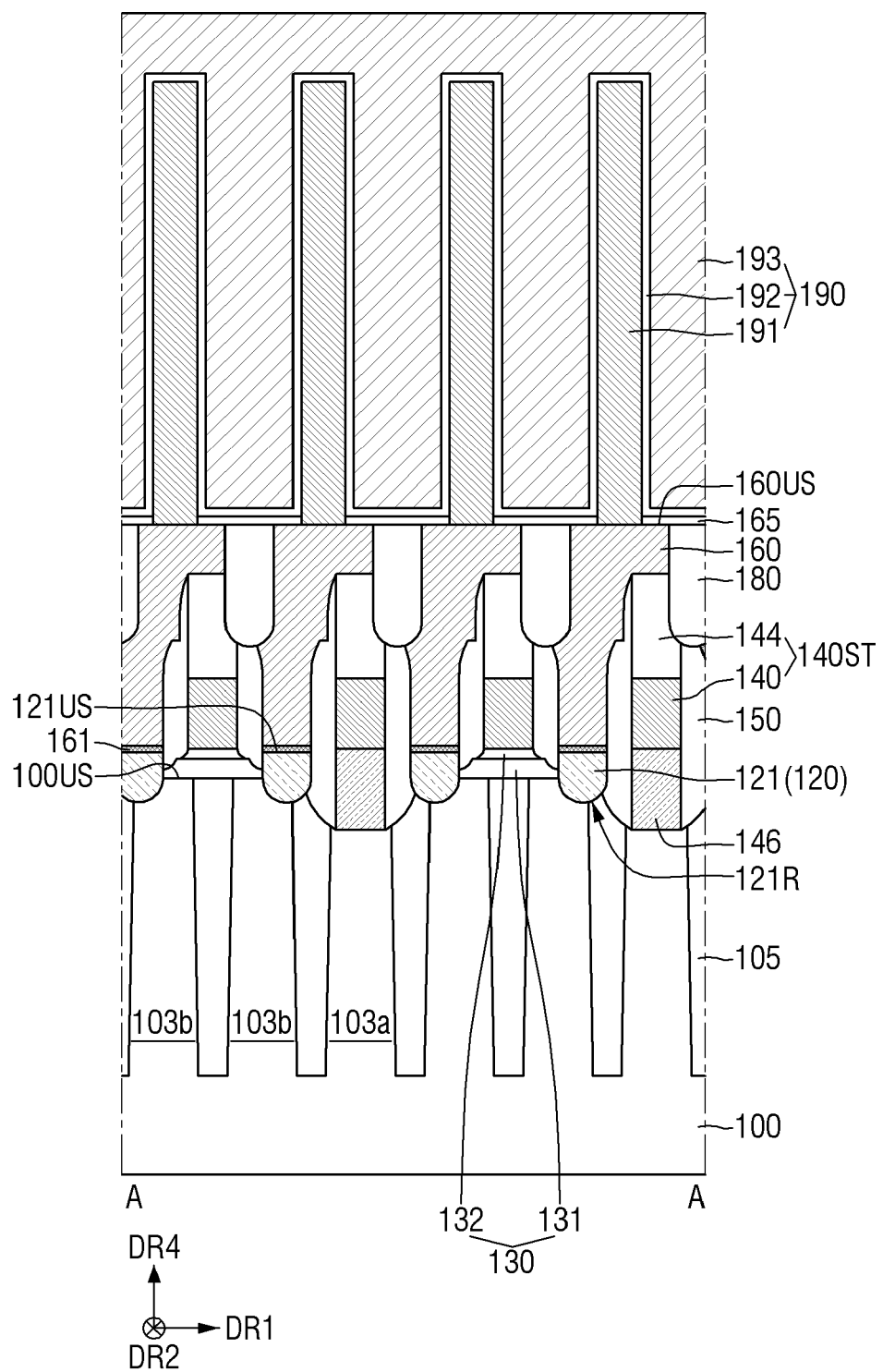
FIGS. 8 and 9 are views illustrating a semiconductor memory device according to embodiments of the present disclosure.
Figure 9:
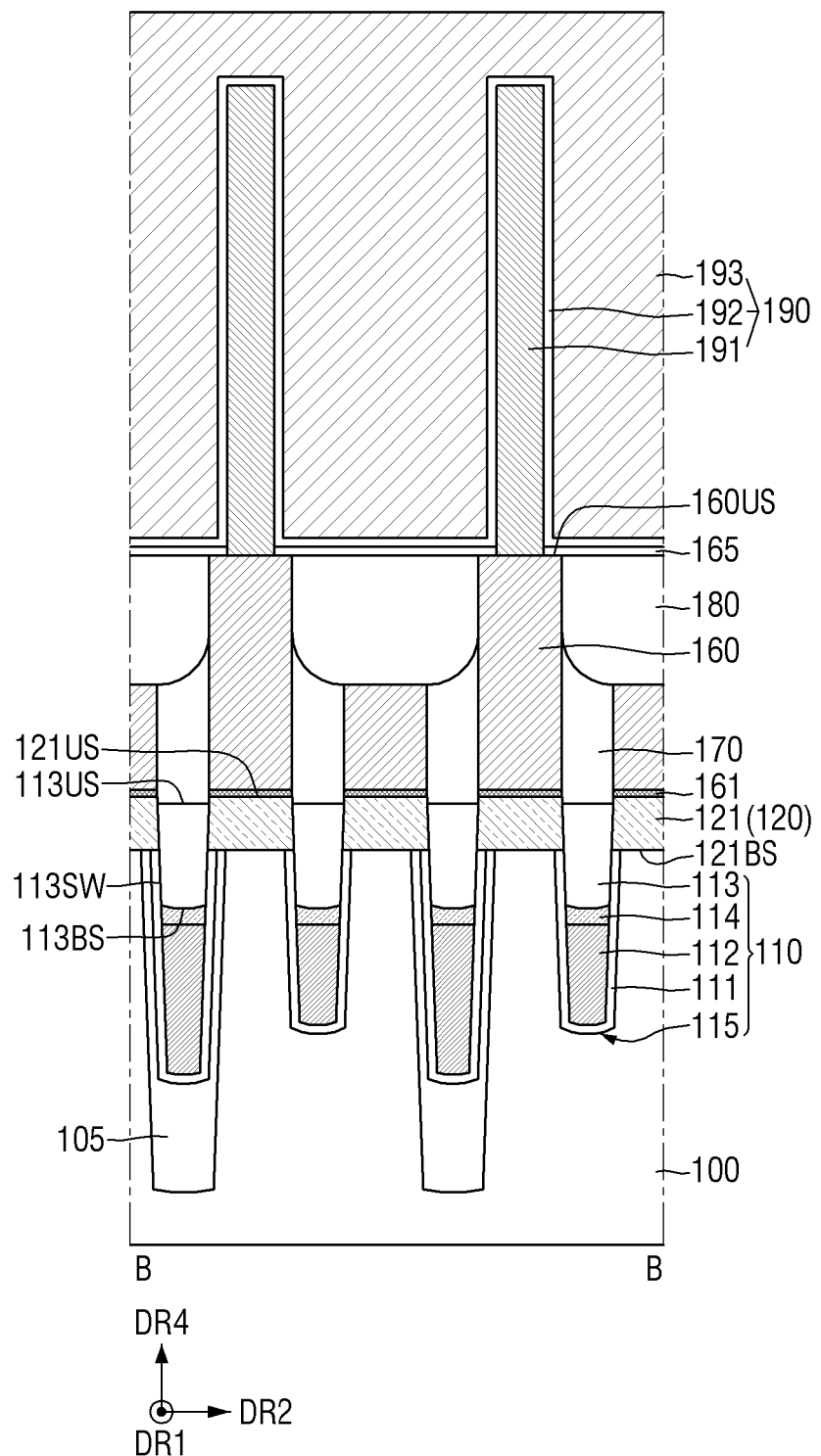
Figure 10:
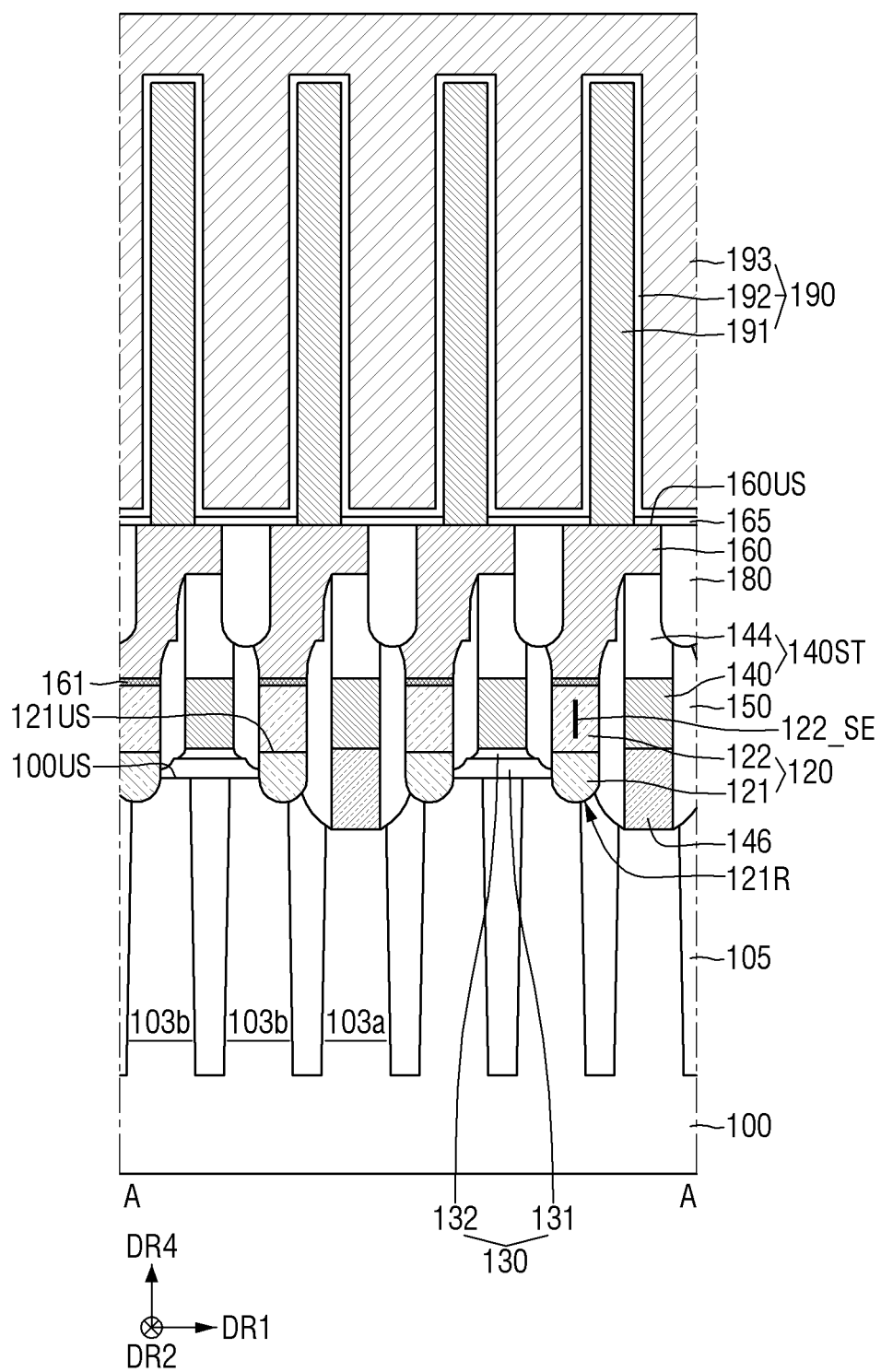
FIG. 10 is a view illustrating a semiconductor memory device according to embodiments of the present disclosure.
Figure 11:
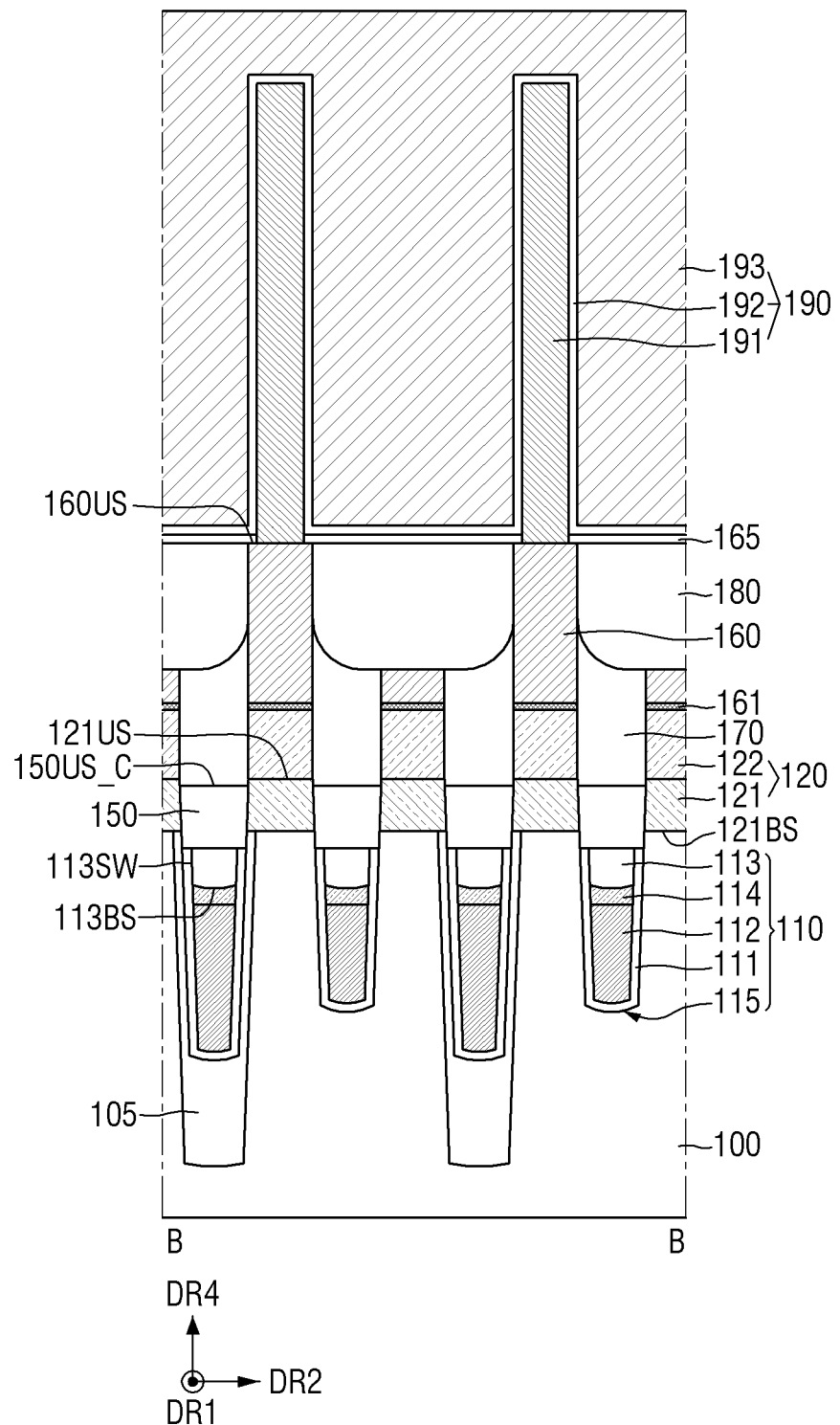
FIG. 11 is a view illustrating a semiconductor memory device according to embodiments of the present disclosure.
Figure 12:
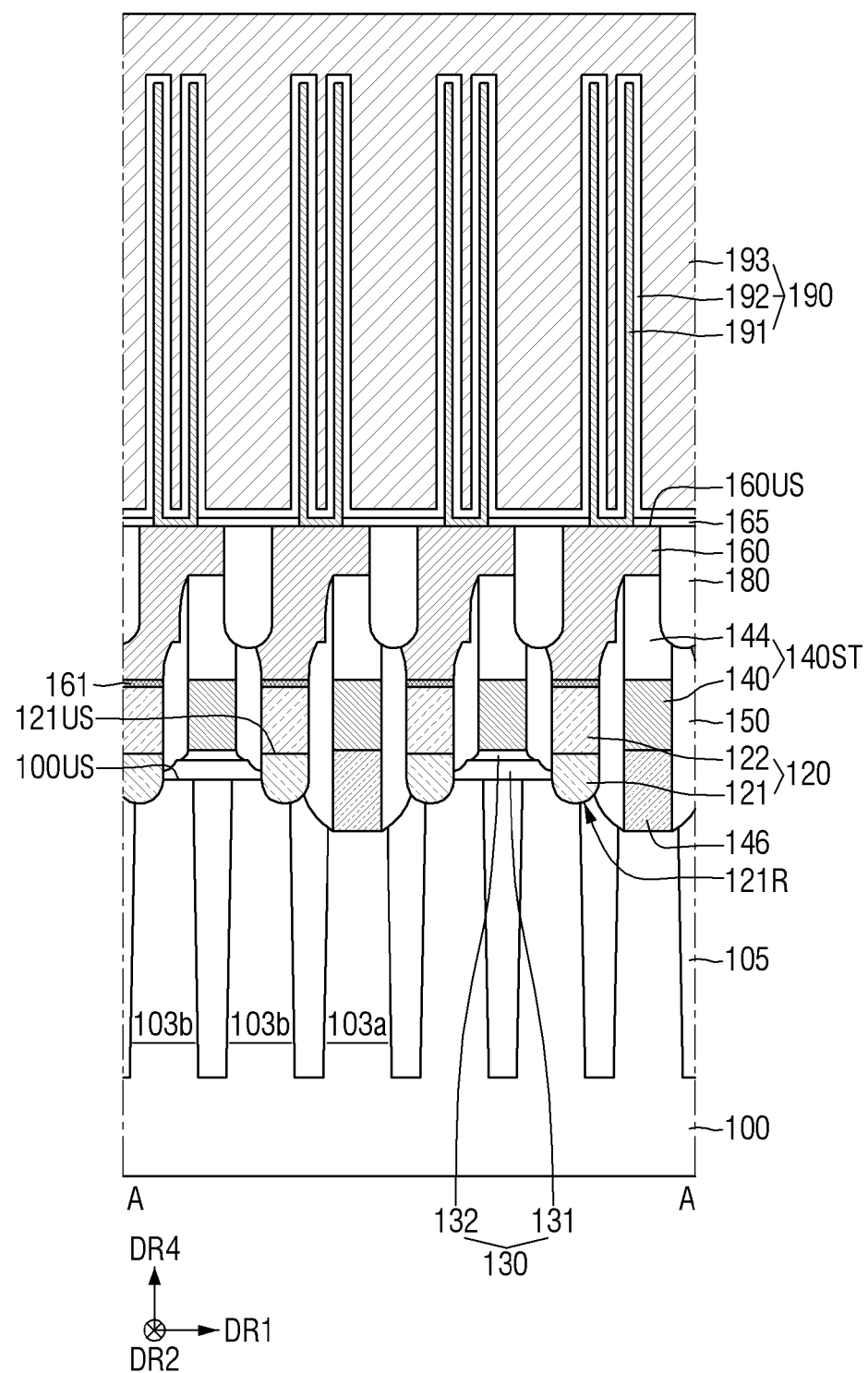
FIG. 12 is a view illustrating a semiconductor memory device according to embodiments of the present disclosure.

FIGS. 8 and 9 are views illustrating a semiconductor memory device according to embodiments of the present disclosure. FIG. 10 is a view illustrating a semiconductor memory device according to embodiments of the present disclosure. FIG. 11 is a view illustrating a semiconductor memory device according to embodiments of the present disclosure. FIG. 12 is a view illustrating a semiconductor memory device according to embodiments of the present disclosure. For ease of description, the following description will focus on differences from the semiconductor device described above with reference to FIGS. 1 through 7.

Referring to FIGS. 8 and 9, in a semiconductor memory device according to embodiments, each storage contact 120 may include a lower storage contact 121 and may not include an upper storage contact 122.

A contact silicide layer 161 may contact each storage pad 160 and each lower storage contact 121.

Referring to FIG. 10, in a semiconductor memory device according to embodiments, an upper storage contact 122 may further include a seam pattern 122_SE.

In some of the plurality of storage contacts 120, the upper storage contact 122 may include the seam pattern 122_SE. In the rest of the storage contacts 120, the upper storage contact 122 does not include the seam pattern 122_SE.

In one variation, and in each storage contact 120, the upper storage contact 122 may include the seam pattern 122_SE.

Referring to FIG. 11, in a semiconductor memory device according to embodiments, a portion of a bit line spacer 150 may be between each fence pattern 170 and each cell gate capping pattern 113 in cross section.

In a process of forming bit line contact recesses for forming bit line contacts 146 (see FIGS. 3 and 5), the cell gate capping patterns 113 may partially be etched. A portion of the bit line spacer 150 on sidewalls of each bit line contact 146 may be seen in a cross-sectional view of FIG. 11.

The bit line spacer 150 may include a cross-sectional upper surface 150US_C. The cross-sectional upper surface 150US_C of the bit line spacer 150 is different from an upper surface of the bit line spacer 150 of FIG. 3. An upper surface 121US of each lower storage contact may extend above the cross-sectional upper surface 150US_C of the bit line spacer 150, but the present disclosure is not limited thereto.

Referring to FIG. 12, in a semiconductor memory device according to embodiments, lower electrodes 191 may have a cylindrical shape.

Each of the lower electrodes 191 may include a bottom portion extending along an upper surface 160US of a storage pad and a sidewall portion extending from the bottom portion in the fourth direction DR4.

FIGS. 13 through 26 are views for explaining intermediate steps of a method of manufacturing a semiconductor memory device according to embodiments of the present disclosure. In the following description of the manufacturing method, a description of elements and features described using FIGS. 1 through 12 will be given briefly or omitted.

Figure 13:
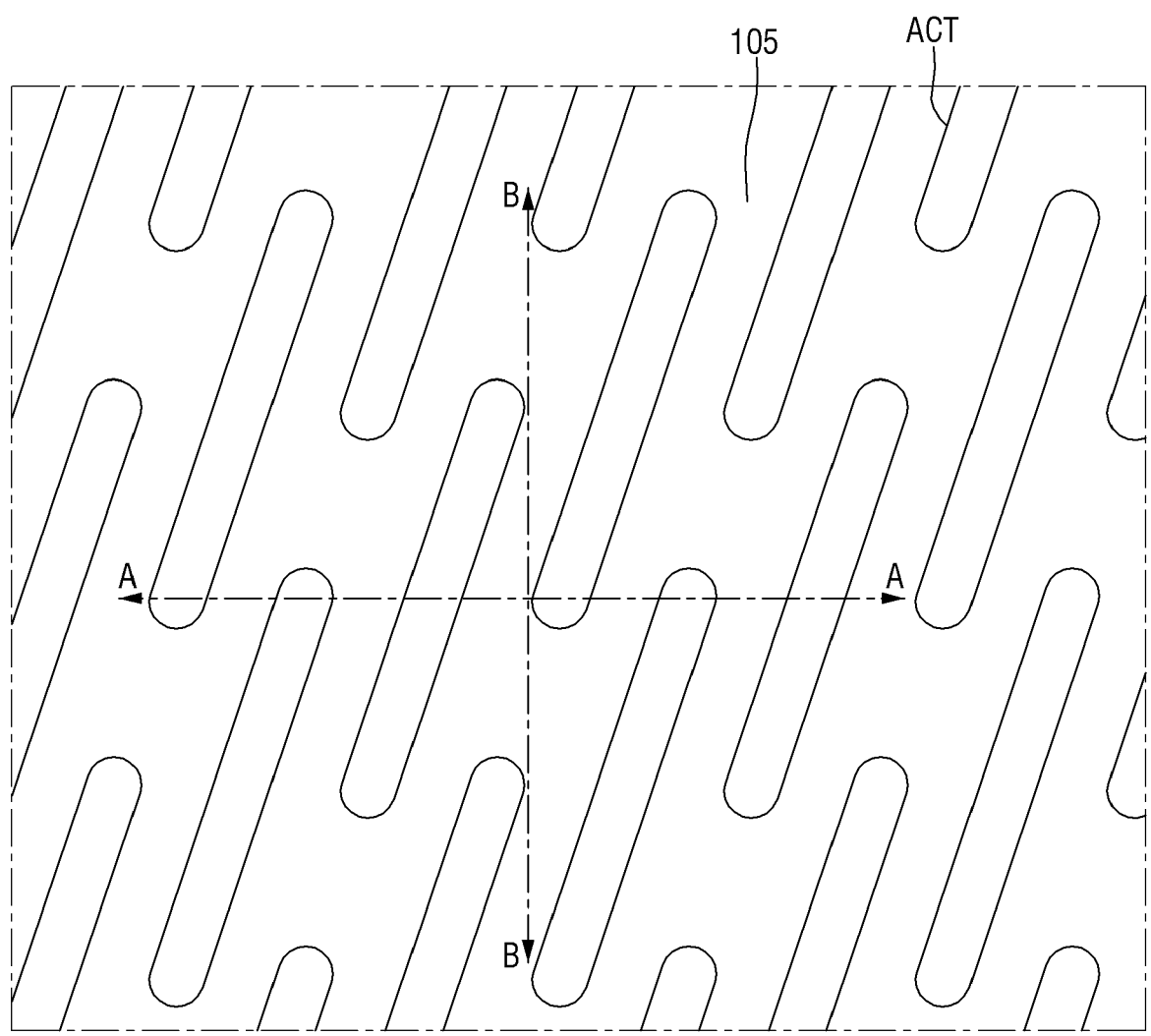
FIGS. 13, 14, 15, 16, 17, 18, 19, 20, 21, 22, 23, 24, 25, and 26 are views illustrating a method of manufacturing a semiconductor memory device according to embodiments of the present disclosure.
Figure 13:
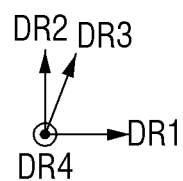

Referring to FIG. 13, a cell element isolation layer 105 may be formed in a substrate 100.

The substrate 100 may include cell active areas ACT defined by the cell element isolation layer 105. The cell active areas ACT may be shaped as bars extending in the third direction DR3.

The subsequent manufacturing process will be described using cross-sectional views taken along lines A-A and B-B of FIG. 13.

Figure 14:
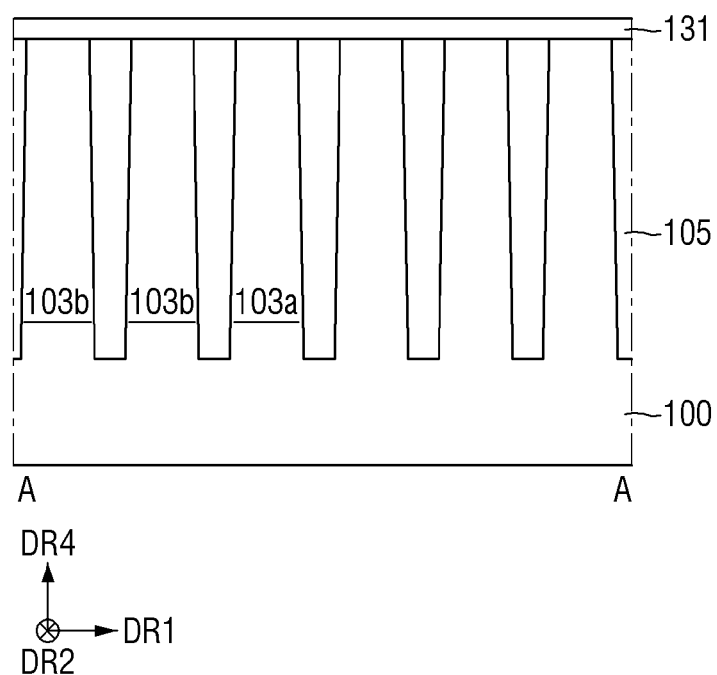
Figure 15:
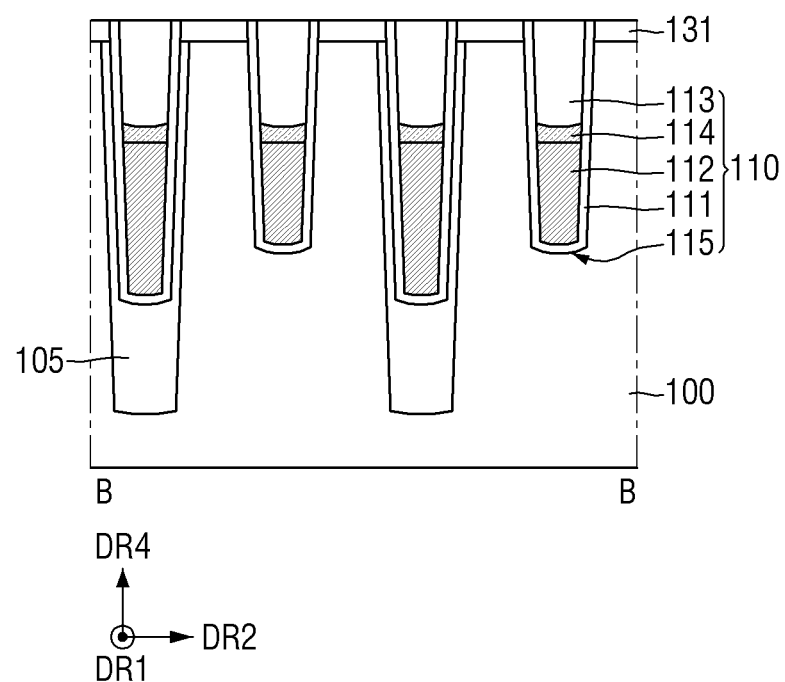

Referring to FIGS. 14 and 15, a lower cell buffer insulating layer 131 is formed on the substrate 100 and the cell element isolation layer 105.

Next, cell gate electrodes 112 are formed in the substrate 100 and the cell element isolation layer 105.

The cell gate electrodes 112 may extend in the first direction DR1. The cell gate electrodes 112 may be spaced apart from each other in the second direction DR2.

More specifically, cell gate structures 110 extending in the first direction DR1 are formed in the substrate 100, the cell element isolation layer 105, and the lower cell buffer insulating layer 131. Each of the cell gate structures 110 may include a cell gate trench 115, a cell gate insulating layer 111, a cell gate electrode 112, a cell gate capping pattern 113, and a cell gate capping conductive layer 114.

The cell gate electrode 112 intersects each of the cell active areas ACT (see FIG. 13). Each of the cell active areas ACT may be divided into a bit line connection part 103a and a storage connection part 103b by the cell gate electrode 112.

Each of the cell active areas ACT includes the bit line connection part 103a located in the middle of the cell active area ACT and the storage connection part 103b located in end portions of the cell active area ACT.

The cell gate insulating layer 111 may extend to an upper surface of the lower cell buffer insulating layer 131. An upper surface of the cell gate capping pattern 113 may lie in the same plane as the upper surface of the lower cell buffer insulating layer 131.

Figure 16:
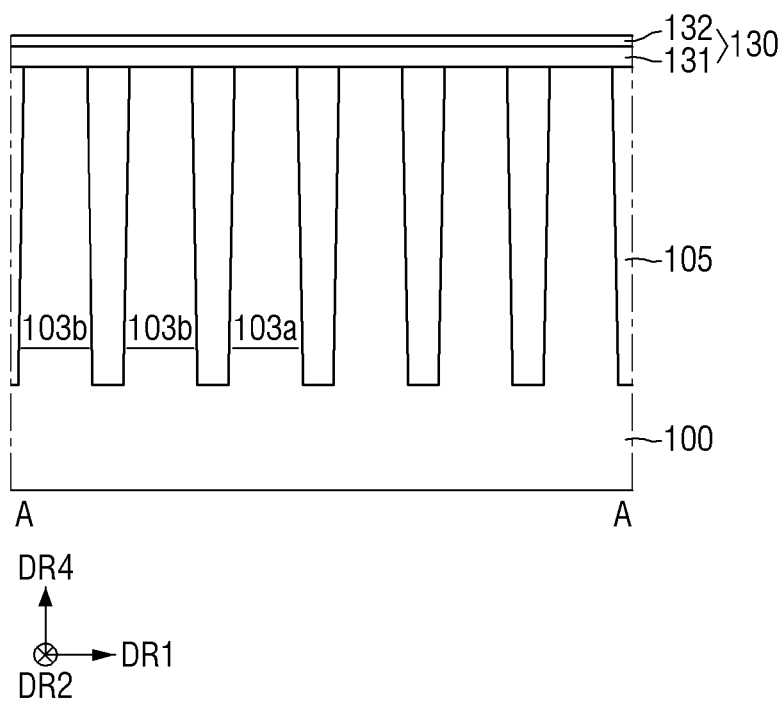
Figure 17:
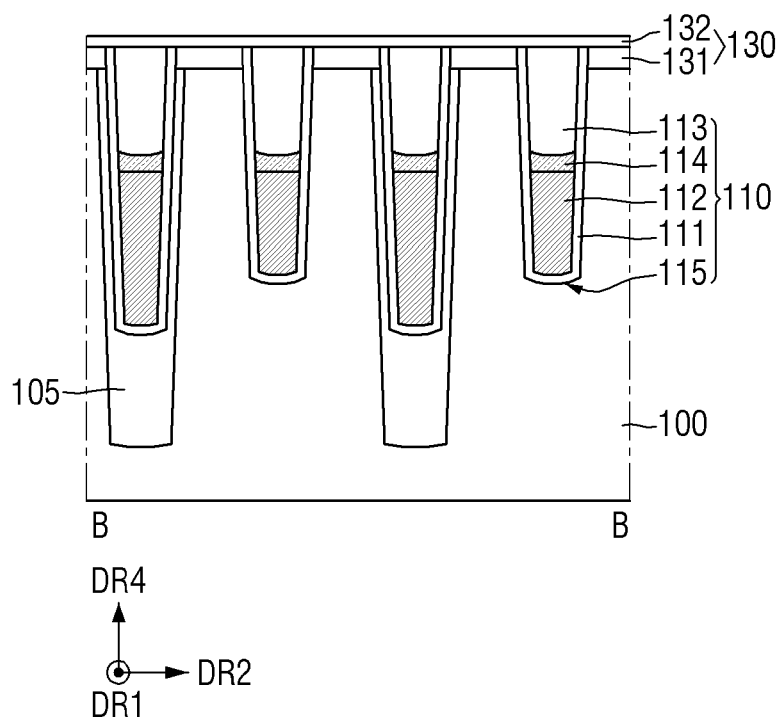

Referring to FIGS. 16 and 17, an upper cell buffer insulating layer 132 may be formed on the lower cell buffer insulating layer 131.

A cell buffer insulating layer 130 may be formed on the substrate 100 and the cell element isolation layer 105. The upper cell buffer insulating layer 132 may be formed on the cell gate structures 110. The upper cell buffer insulating layer 132 may contact the upper surfaces of the cell gate capping patterns 113.

Figure 18:
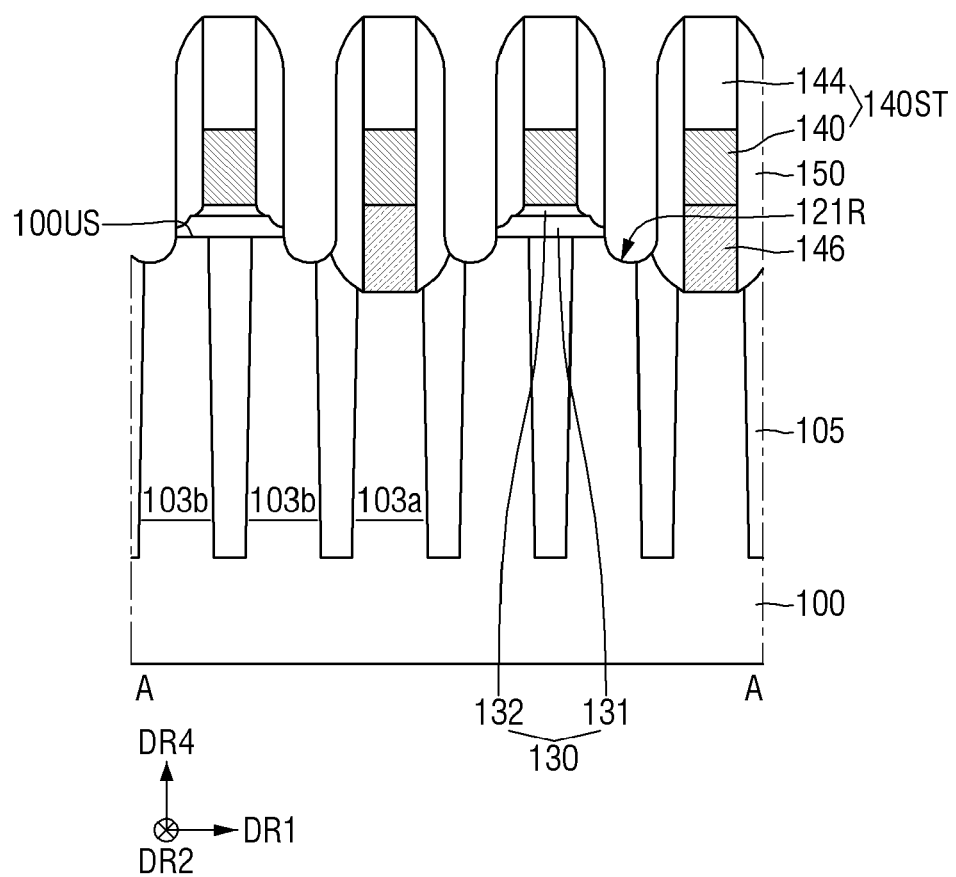
Figure 19:
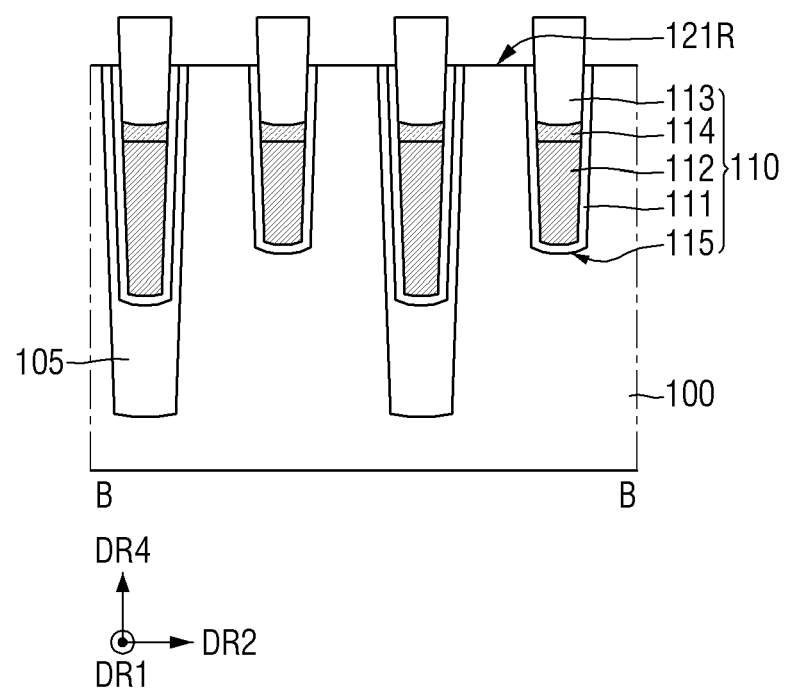

Referring to FIGS. 18 and 19, cell conductive lines 140 may be formed on the substrate 100 and the cell element isolation layer 105.

The cell conductive lines 140 may extend in the second direction DR2. The cell conductive lines 140 may be spaced apart from each other in the first direction DR1.

More specifically, bit line structures 140ST extending in the second direction DR2 are formed on the cell buffer insulating layer 130. Each of the bit line structures 140ST may include a cell conductive line 140 and a cell line capping layer 144. A bit line spacer 150 may be formed on sidewalls of the bit line structures 140ST.

While the bit line structures 140ST are being formed, bit line contacts 146 may also be formed.

Next, each storage contact recess 121R may be formed between the cell conductive lines 140 adjacent to each other in the first direction DR1.

The storage contact recesses 121R may be formed using the bit line structures 140ST as an etch mask. The storage contact recesses 121R may be formed by removing the substrate 100 and the cell element isolation layer 105.

The storage contact recesses 121R may be defined by the substrate 100, the cell element isolation layer 105, and the bit line spacer 150.

In FIGS. 17 and 19, while the bit line spacer 150 is being formed, the upper cell buffer insulating layer 132 between the cell conductive lines 140 adjacent to each other in the first direction DR1 may be removed. Then, while the storage contact recesses 121R are being formed, the lower cell buffer insulating layer 131 and the cell gate insulating layers 111 may be partially removed. Sidewalls of the cell gate capping patterns 113 may be partially exposed.

Figure 20:
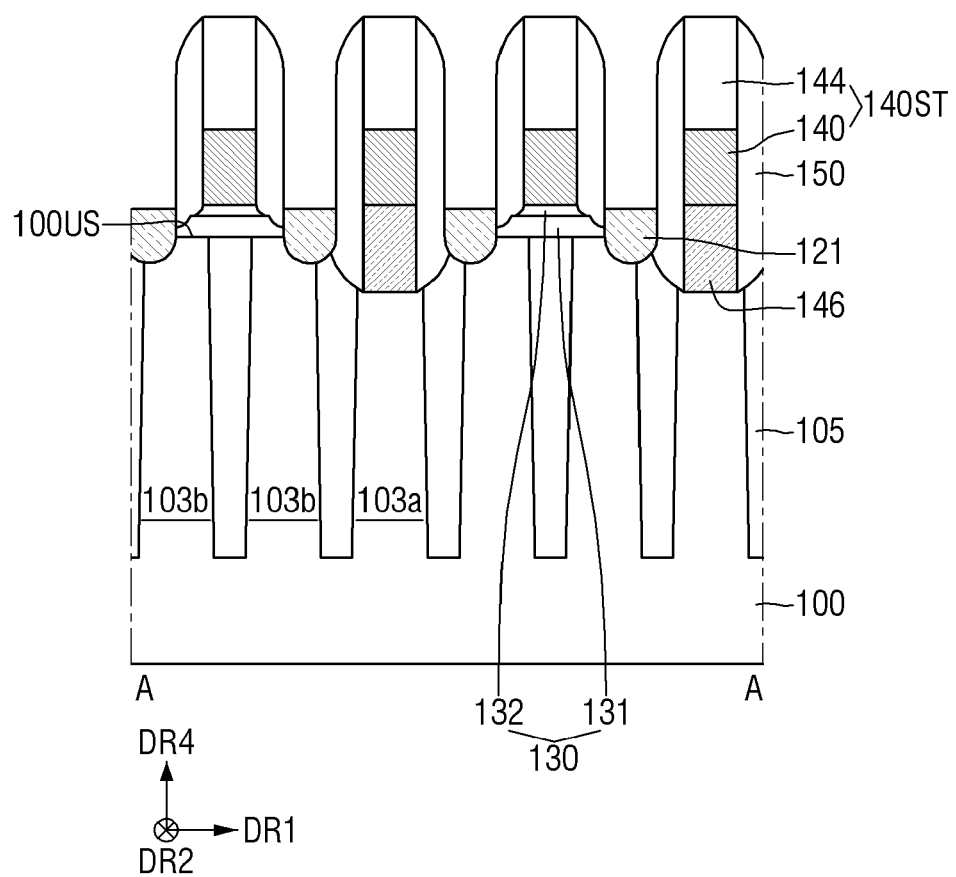
Figure 21:
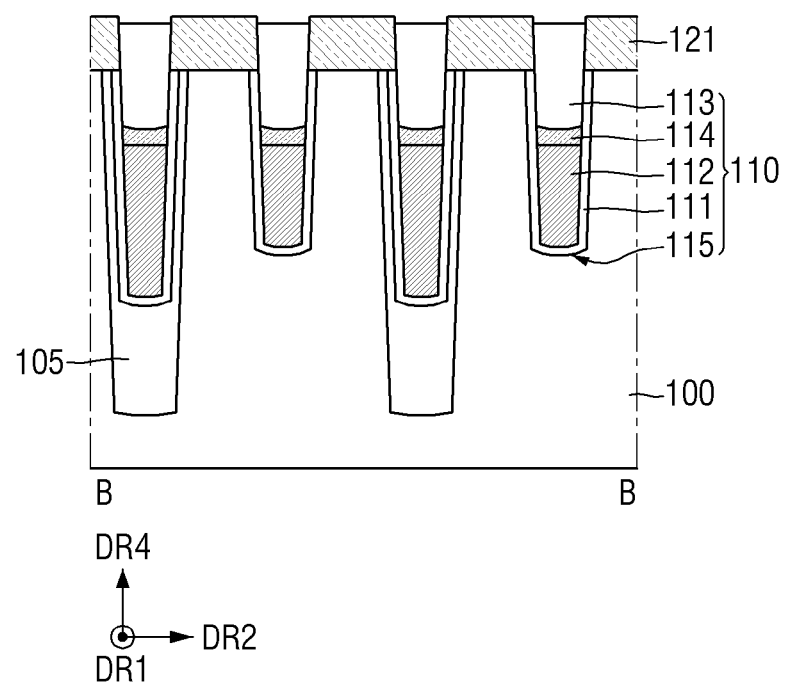

Referring to FIGS. 20 and 21, each lower storage contact 121 is formed between the bit line structures 140ST adjacent to each other in the first direction DR1.

The lower storage contacts 121 are formed using an epitaxial growth method. The lower storage contacts 121 may fill the storage contact recesses 121R.

For example, an upper surface of each lower storage contact 121 may be at a height greater than or equal to that of the upper surface of the lower cell buffer insulating layer 131. In addition, the upper surface of each lower storage contact 121 may be at a height greater than or equal to that of the upper surface of each cell gate capping pattern 113.

Since the lower storage contacts 121 are formed using an epitaxial growth method, no void is generated in a portion connected to each cell active area ACT (see FIG. 13). In addition, since the concentration of impurities included in each lower storage contact 121 can be adjusted, a uniform junction depth can be maintained.

Figure 22:
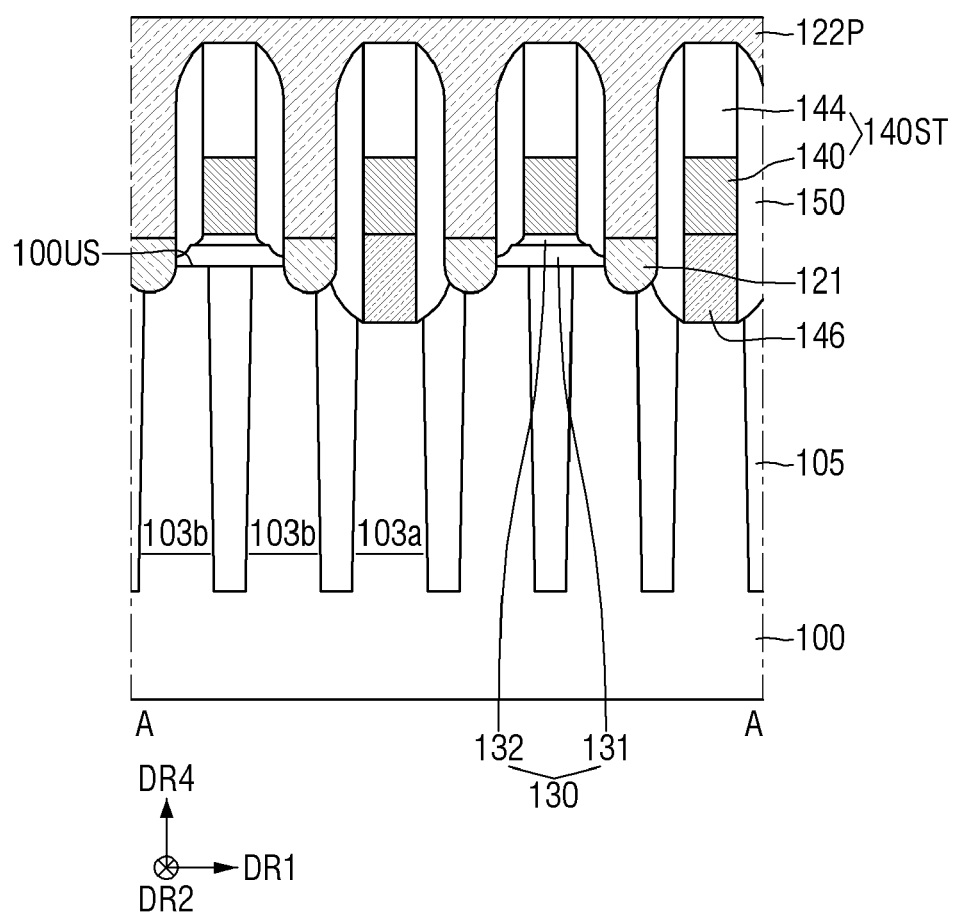
Figure 23:
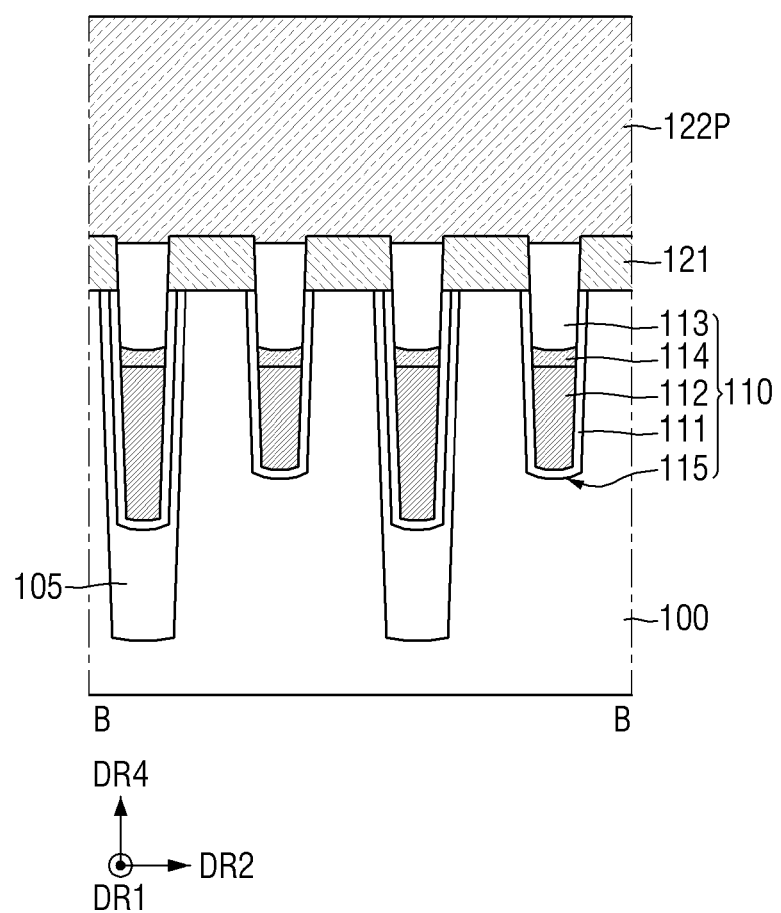

Referring to FIGS. 22 and 23, an upper contact layer 122P may be formed on the lower storage contacts 121.

The upper contact layer 122P may be formed on the cell gate structures 110. The upper contact layer 122P may cover the upper surfaces of the cell gate capping patterns 113. The upper contact layer 122P contacts the lower storage contacts 121. The upper contact layer 122P may be formed through a deposition process. The upper contact layer 122P includes n-type impurities.

Although the upper contact layer 122P is illustrated as covering upper surfaces of the bit line structures 140ST, the present disclosure is not limited thereto.

Figure 24:
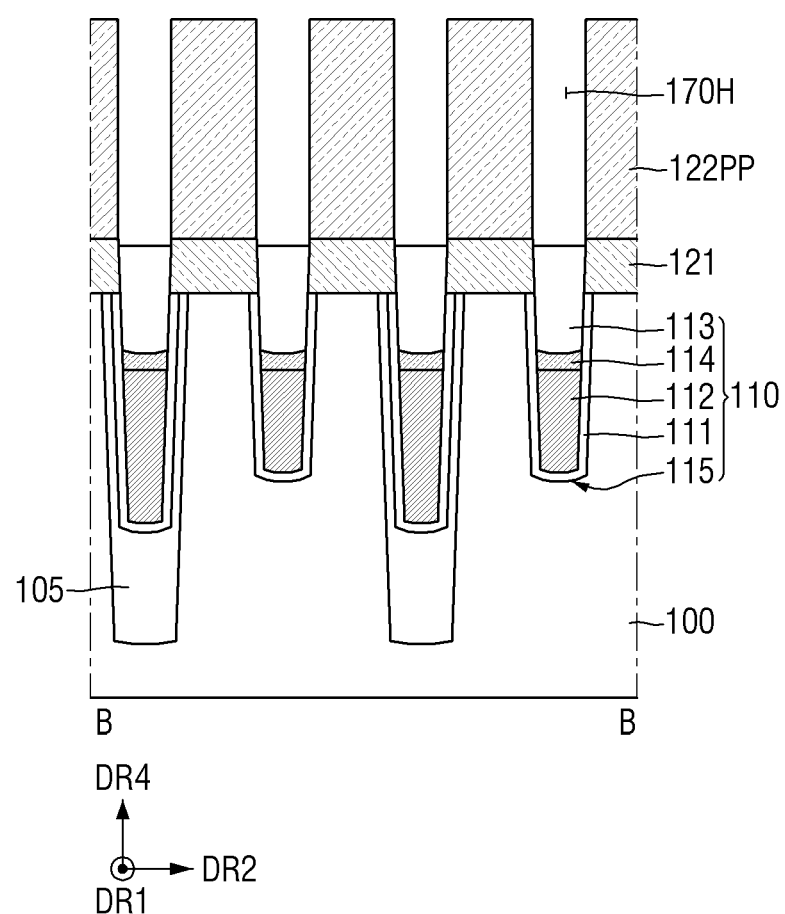

Referring to FIG. 24, upper contact patterns 122PP may be formed by patterning the upper contact layer 122P.

The upper contact patterns 122PP may be separated by fence holes 170H. Each of the upper contact patterns 122PP may be between the bit line structures 140ST (see FIG. 22) adjacent to each other in the first direction DR1. The fence holes 170H may expose the cell gate capping patterns 113.

Figure 25:
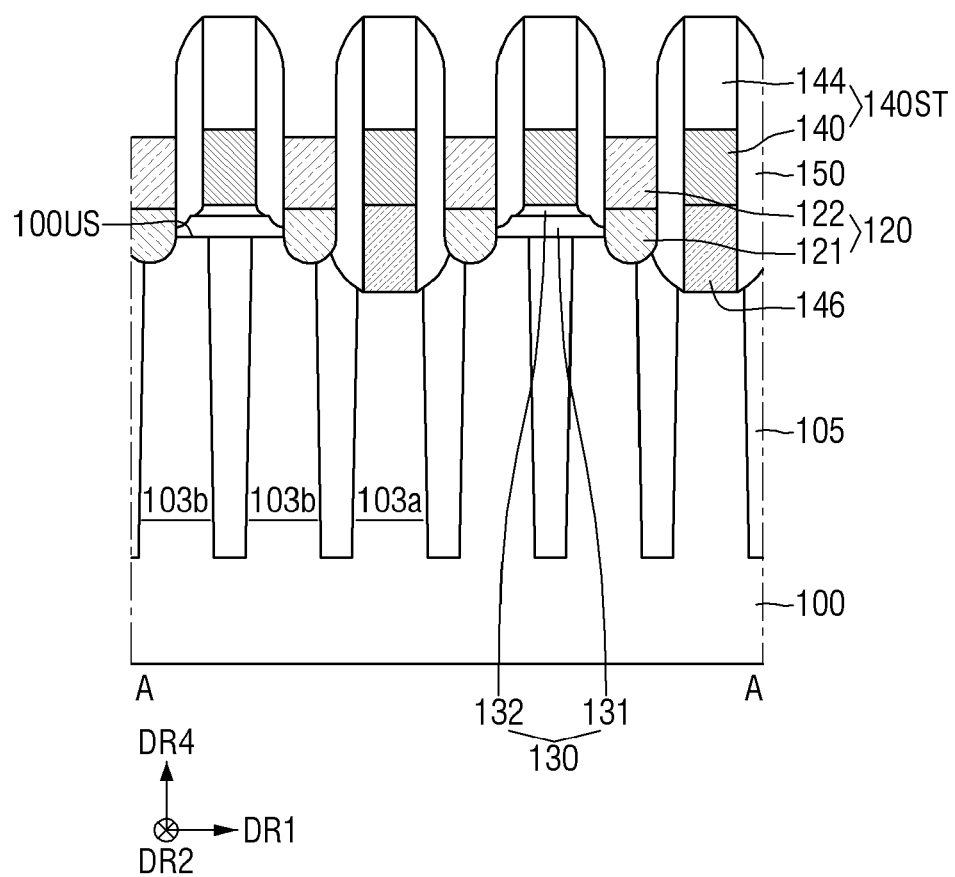
Figure 26:
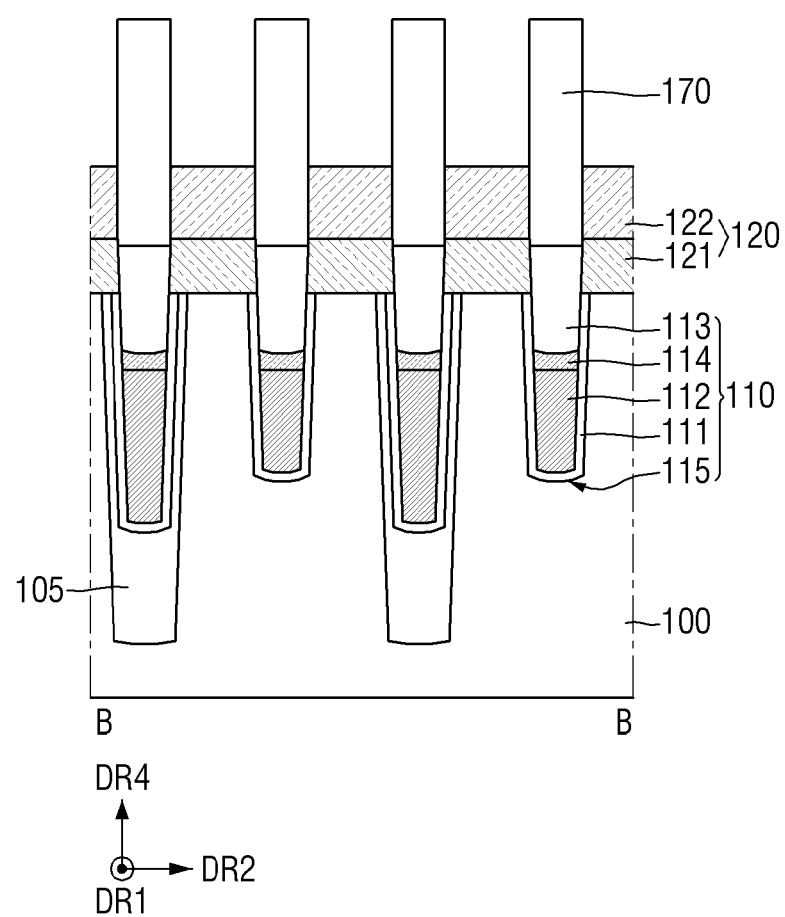

Referring to FIGS. 24 through 26, fence patterns 170 may be formed in the fence holes 170H.

The fence patterns 170 may fill the fence holes 170H. The fence patterns 170 may be formed on the cell gate structures 110.

Next, upper storage contacts 122 may be formed by partially removing the upper contact patterns 122PP. Accordingly, the storage contacts 120, each including the upper storage contact 122 and the lower storage contact 121, may be formed.

Next, referring to FIGS. 3 and 4, storage pads 160 may be formed on the storage contacts 120. In addition, an information storage unit 190 may be formed on the storage pads 160.

Figure 27:
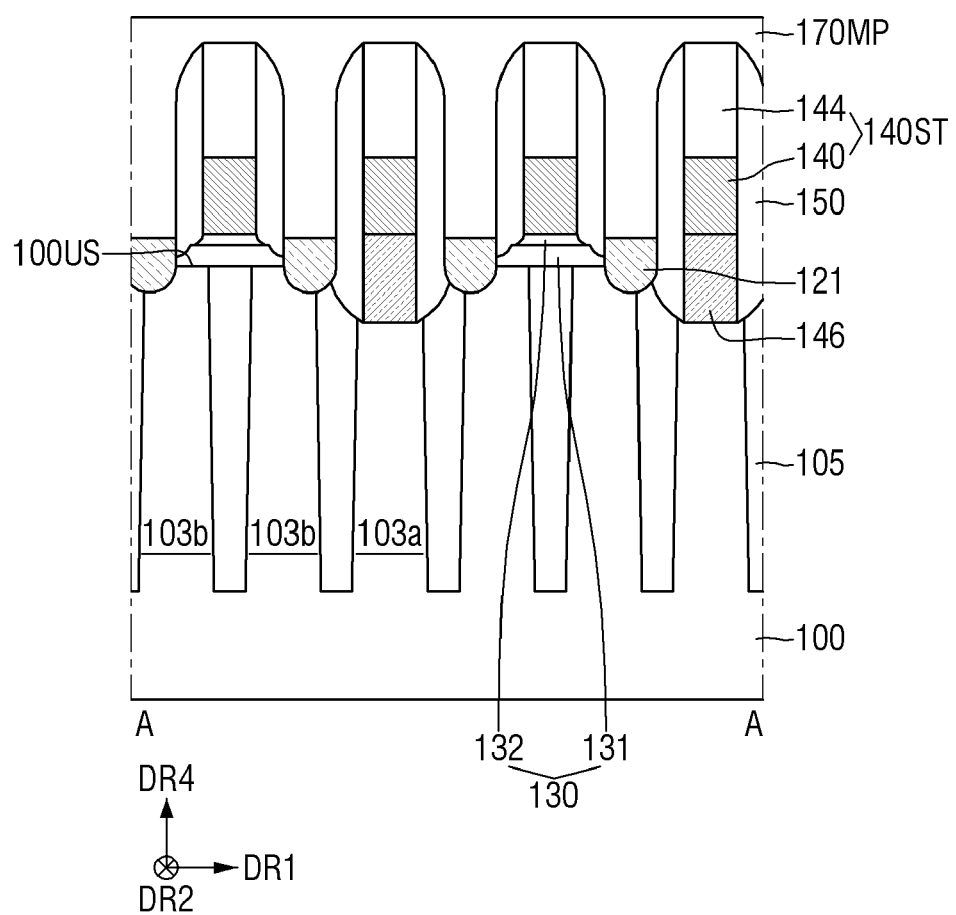
FIGS. 27, 28, and 29 are views illustrating a method of manufacturing a semiconductor memory device according to embodiments of the present disclosure.
Figure 28:
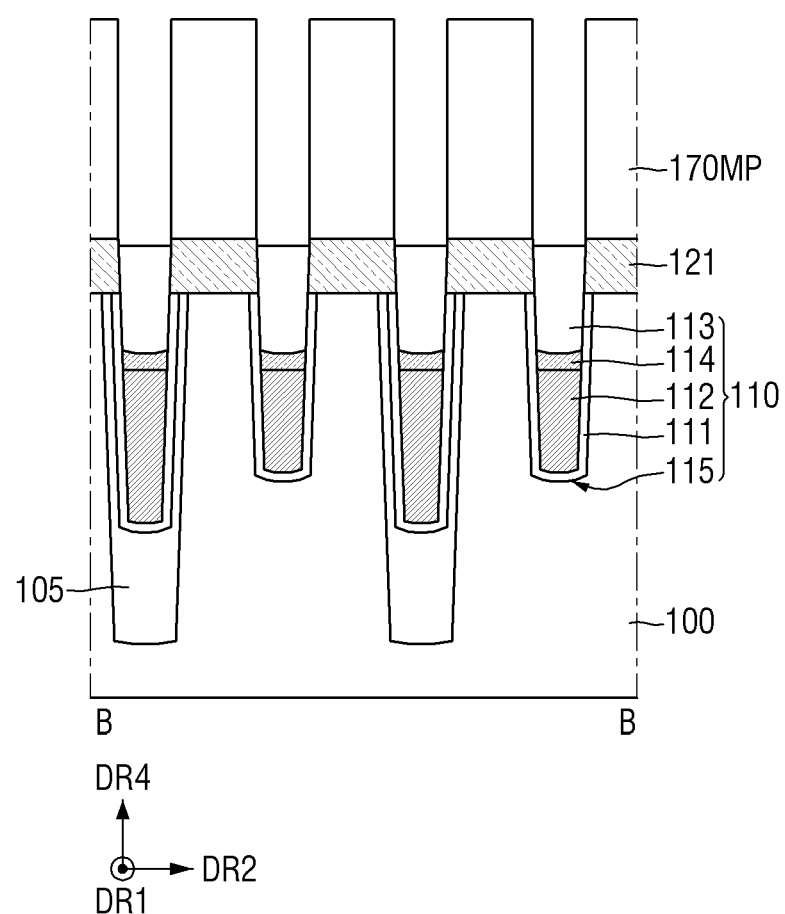
Figure 29:
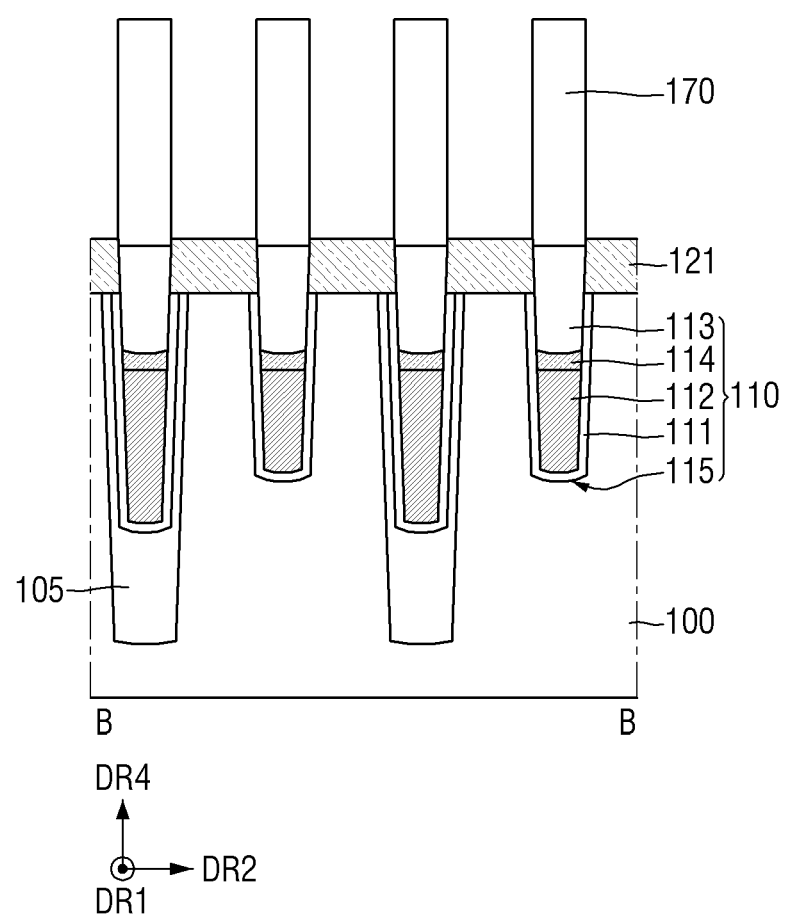

FIGS. 27 through 29 are views for explaining a method of manufacturing a semiconductor memory device according to embodiments of the present disclosure. For reference, FIGS. 27 and 28 may be manufacturing processes performed after the processes described above with reference to FIGS. 20 and 21.

Referring to FIGS. 27 and 28, a fence mold pattern 170MP may be formed on lower storage contacts 121.

The fence mold pattern 170MP may be between bit line structures 140ST adjacent to each other in the first direction DR1. The fence mold pattern 170MP may expose cell gate capping patterns 113.

More specifically, a fence mold layer may be formed on the lower storage contacts 121 and the cell gate structures 110. The fence mold layer may include a material having an etching selectivity with respect to fence patterns 170 (see FIG. 4). Then, the fence mold pattern 170MP exposing the cell gate capping patterns 113 may be formed by patterning the fence mold layer. The fence mold pattern 170MP may include fence mold holes exposing the cell gate capping patterns 113.

Although the fence mold pattern 170MP is illustrated as covering upper surfaces of the bit line structures 140ST, the present disclosure is not limited thereto.

Referring to FIGS. 27 through 29, the fence patterns 170 may be formed on the cell gate structures 110.

Next, the fence mold pattern 170MP may be removed. Accordingly, upper surfaces of the lower storage contacts 121 may be exposed.

Next, referring to FIGS. 3 and 4, upper storage contacts 122 may be formed on the lower storage contacts 121. In addition, storage pads 160 and an information storage unit 190 may be formed.

Alternatively, referring to FIGS. 8 and 9, the storage pads 160 and the information storage unit 190 may be formed on the lower storage contacts 121.

FIGS. 30 through 36 are views for explaining a method of manufacturing a semiconductor memory device according to embodiments of the present disclosure. For reference, FIGS. 30 and 31 may be manufacturing processes performed after the processes described above with reference to FIGS. 16 and 17.

Figure 30:
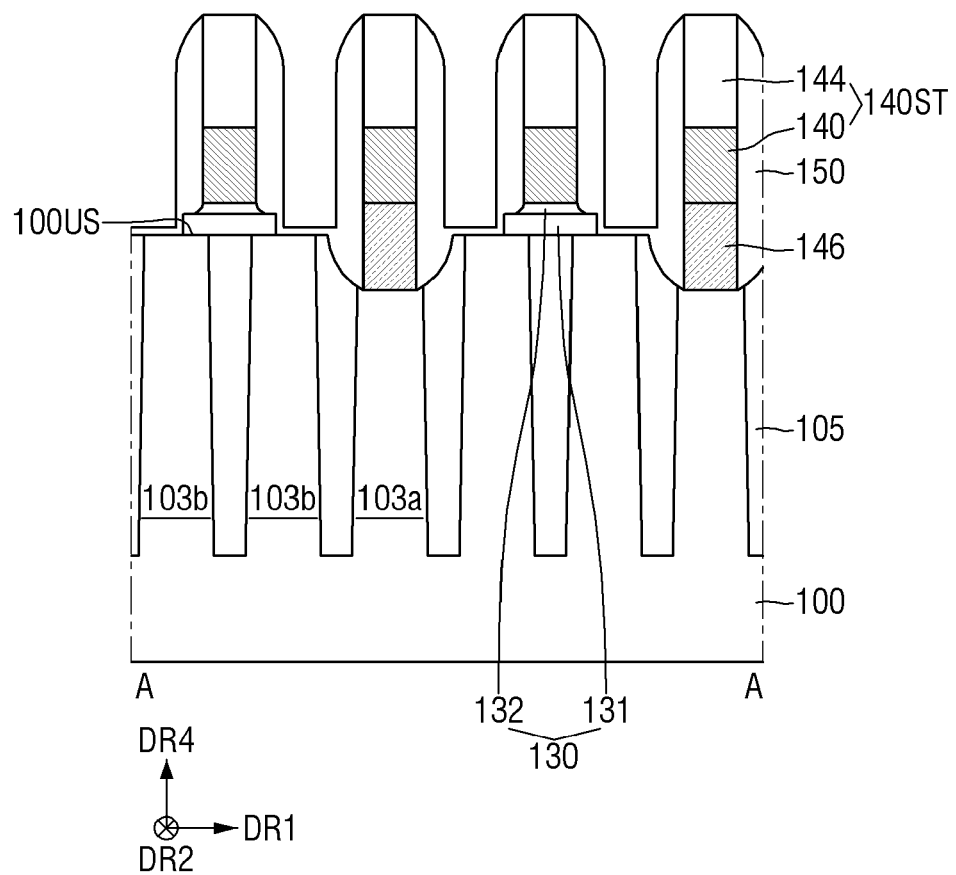
FIGS. 30, 31, 32, 33, 34, 35, and 36 are views illustrating a method of manufacturing a semiconductor memory device according to embodiments of the present disclosure.
Figure 31:
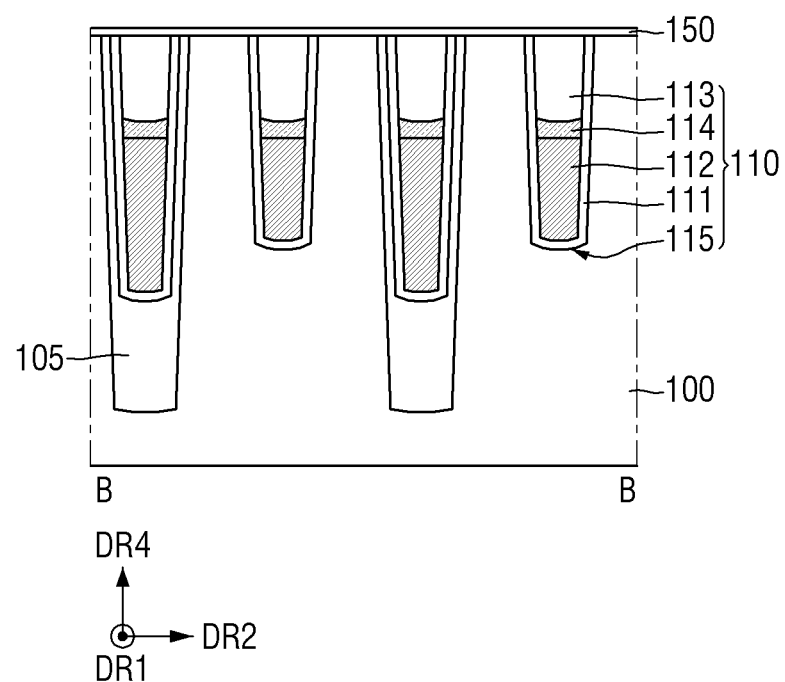

Referring to FIGS. 30 and 31, bit line structures 140ST may be formed on a substrate 100 and a cell element isolation layer 105.

A bit line spacer 150 may be formed on sidewalls of the bit line structures 140ST. The bit line structures 140ST adjacent to each other in the first direction DR1 may be connected by a portion of the bit line spacer 150.

In FIG. 31, a portion of the bit line spacer 150 may extend along upper surfaces of cell gate capping patterns 113 and an upper surface of the substrate 100. While the bit line spacer 150 is being formed, portions of the cell gate capping patterns 113 extending above the upper surface of the substrate 100 may be removed.

Figure 32:
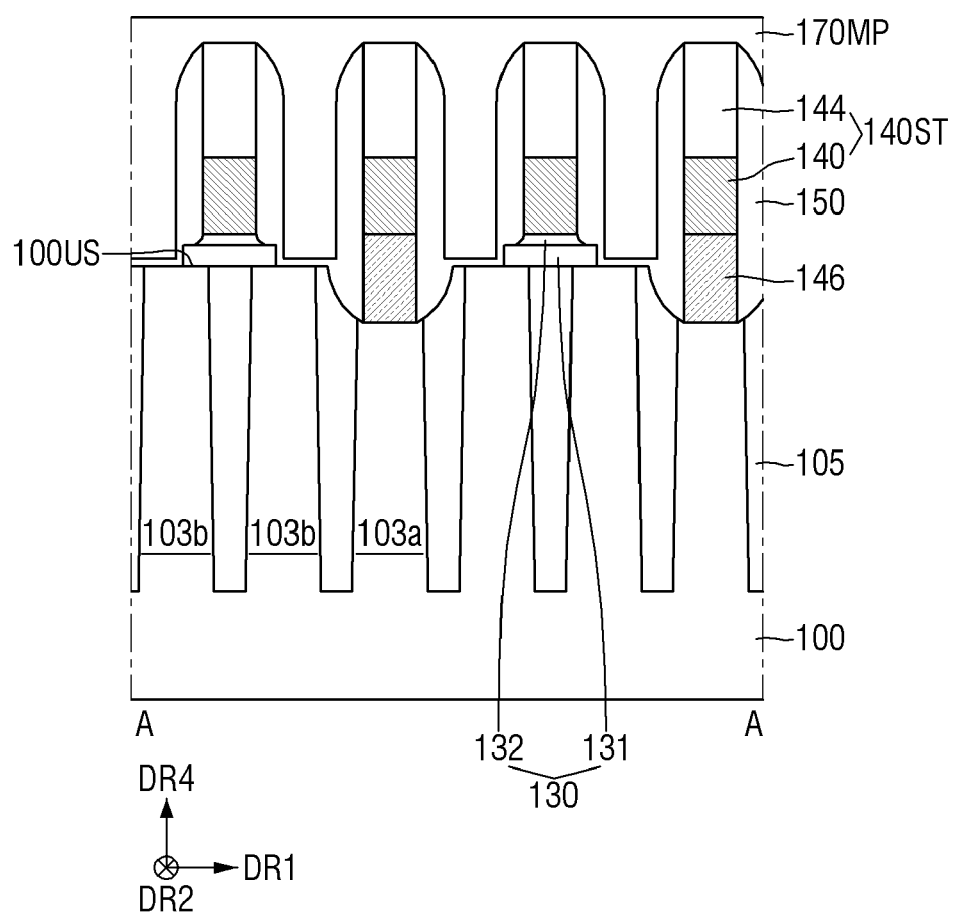
Figure 33:
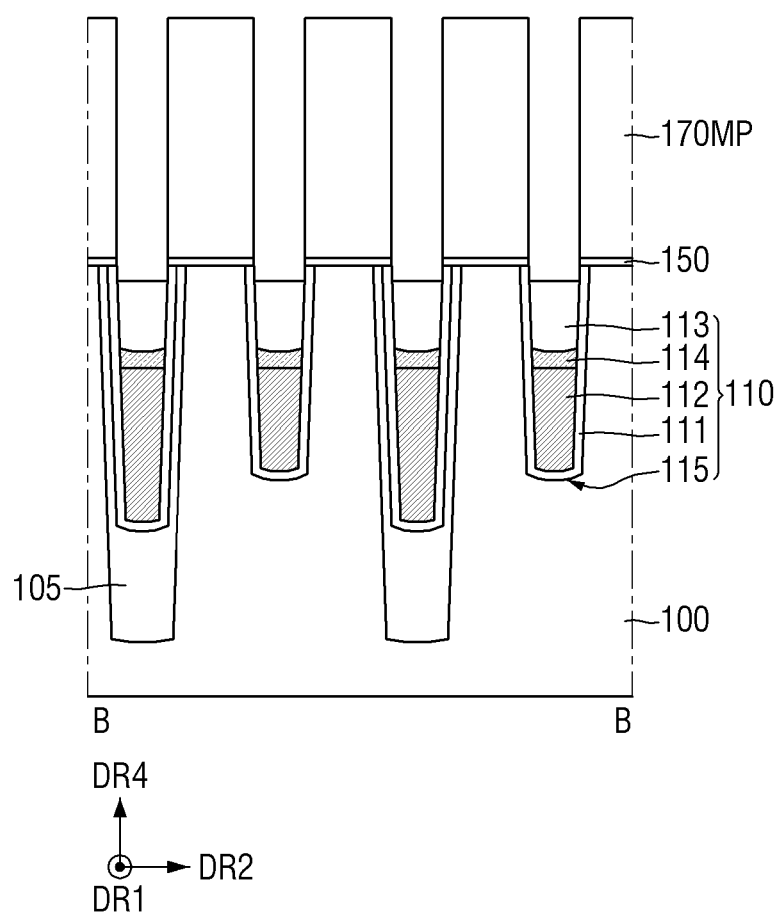

Referring to FIGS. 32 and 33, a fence mold pattern 170MP may be formed on the bit line spacer 150.

The fence mold pattern 170MP may be between the bit line structures 140ST adjacent to each other in the first direction DR1. The fence mold pattern 170MP may expose the cell gate capping patterns 113.

In FIG. 33, the fence mold pattern 170MP may include fence mold holes exposing the cell gate capping patterns 113. The fence mold holes may pass through the bit line spacer 150.

Figure 34:
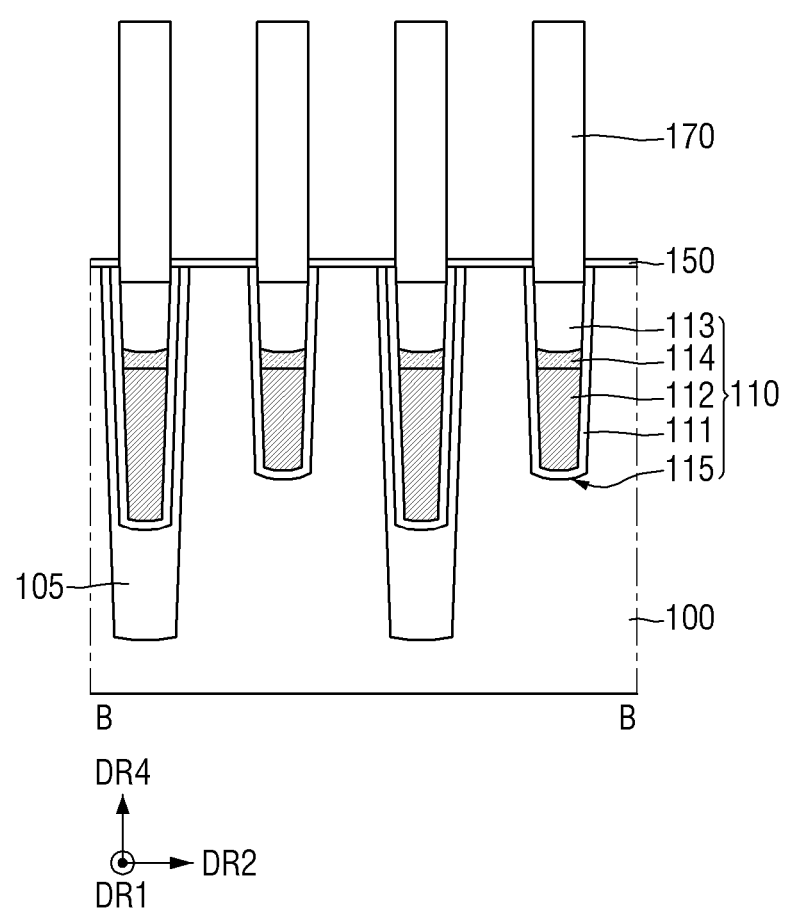

Referring to FIGS. 32 through 34, fence patterns 170 may be formed on the cell gate structures 110.

The fence patterns 170 may fill the fence mold holes of the fence mold pattern 170MP. Next, the fence mold pattern 170MP may be removed.

Figure 35:
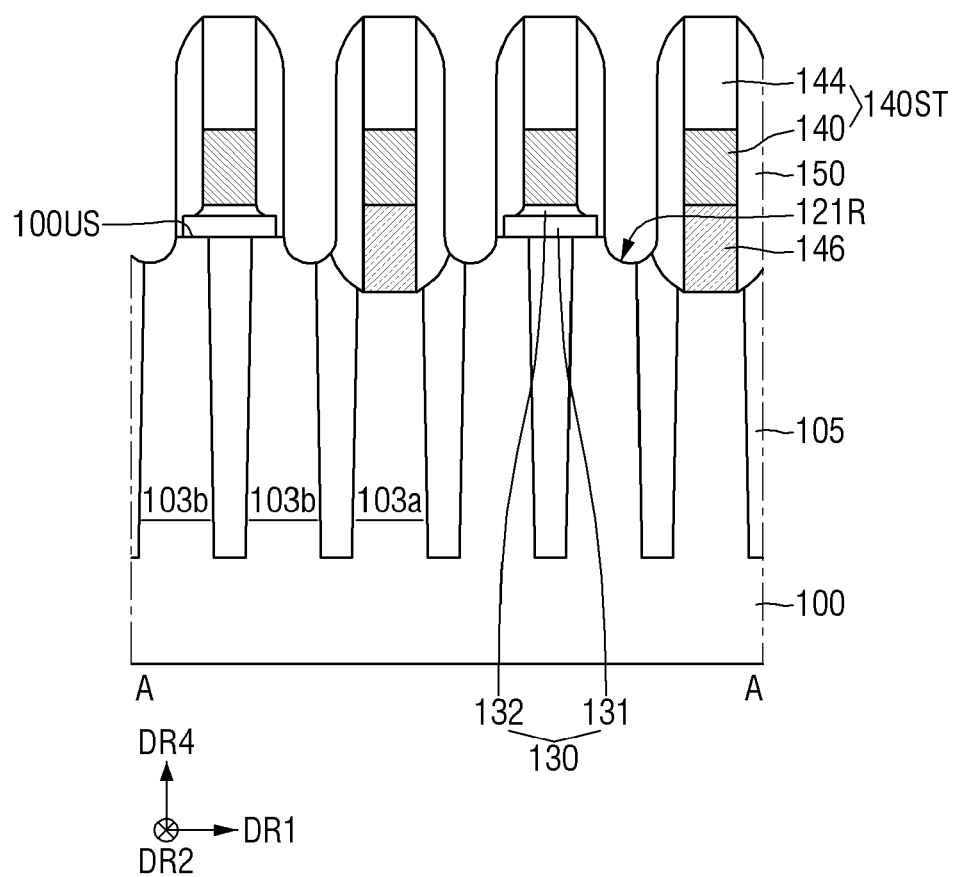
Figure 36:
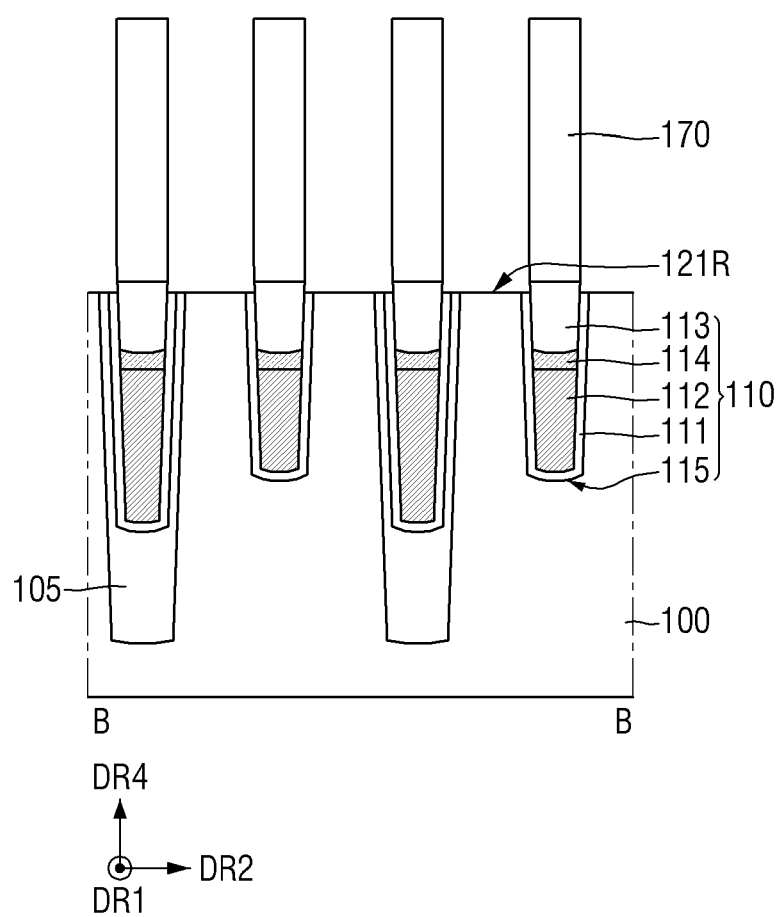

Referring to FIGS. 35 and 36, each storage contact recess 121R may be formed between cell conductive lines 140 adjacent to each other in the first direction DR1.

The storage contact recesses 121R may be formed using the bit line structures 140ST and the fence patterns 170 as an etch mask.

Next, lower storage contacts 121 (see FIG. 3) may be formed to fill the storage contact recesses 121R. In addition, upper storage contacts 122 and storage pads 160 may be formed on the lower storage contacts 121. Alternatively, only the storage pads 160, not the upper storage contacts 122, may be formed on the lower storage contacts 121.

Although the embodiments of the present disclosure have been described with reference to the accompanying drawings, the present disclosure is not limited to the above embodiments and may be implemented in various different forms. Those of ordinary skill in the technical field to which the present disclosure belongs will be able to understand that the present disclosure may be implemented in other specific forms without changing the technical idea or essential characteristics of the present disclosure. Therefore, it should be understood that the embodiments as described above are not restrictive but illustrative in all respects.

What is claimed is:

1. A semiconductor memory device comprising:
a substrate comprising an element isolation layer;
a bit line that extends on the substrate in a first direction;
a cell buffer insulating layer between the bit line and the substrate and comprising an upper cell buffer insulating layer and a lower cell buffer insulating layer;
a lower storage contact on a plurality of sides of the bit line and comprising a semiconductor epitaxial pattern;
a storage pad on the lower storage contact and connected to the lower storage contact; and
an information storage unit on the storage pad and connected to the storage pad,
wherein the upper cell buffer insulating layer is between the lower cell buffer insulating layer and the bit line, and each of the lower cell buffer insulating layer and the upper cell buffer insulating layer comprises an upper surface and a lower surface that are opposite to each other,
wherein a height from an upper surface of the lower storage contact to an upper surface of the storage pad is less than or equal to a height from the upper surface of the lower cell buffer insulating layer to the upper surface of the storage pad.

2. The semiconductor memory device of claim 1, further comprising an upper storage contact between the lower storage contact and the storage pad, wherein the upper storage contact comprises a semiconductor material.

3. The semiconductor memory device of claim 2, wherein the semiconductor material is a polycrystalline semiconductor material.

4. The semiconductor memory device of claim 2, wherein the lower storage contact further comprises an impurity pile-up region comprising impurities at a boundary with the upper storage contact.

5. The semiconductor memory device of claim 4, wherein the impurities comprise at least one of carbon and nitrogen.

6. The semiconductor memory device of claim 1, further comprising a contact silicide layer between the lower storage contact and the storage pad, wherein the contact silicide layer is connected to the lower storage contact and the storage pad.

7. The semiconductor memory device of claim 1, wherein the height from the upper surface of the lower storage contact to the upper surface of the storage pad is less than or equal to a height from the upper surface of the upper cell buffer insulating layer to the upper surface of the storage pad.

8. A semiconductor memory device comprising:
a substrate comprising an element isolation layer;
a cell gate structure within the substrate and the element isolation layer and comprising a word line and a cell gate capping pattern;
a fence pattern on the cell gate structure;
a lower storage contact on a plurality of sides of the cell gate structure and comprising a semiconductor epitaxial pattern;
a storage pad on the lower storage contact and connected to the lower storage contact; and
an information storage unit on the storage pad and connected to the storage pad,
wherein the cell gate capping pattern comprises an upper surface and a lower surface that are opposite to each other, a height from a lower surface of the lower storage contact to an upper surface of the storage pad is greater than a height from the upper surface of the cell gate capping pattern to the upper surface of the storage pad, and a height from an upper surface of the substrate to the upper surface of the storage pad is greater than the height from the upper surface of the cell gate capping pattern to the upper surface of the storage pad.

9. The semiconductor memory device of claim 8, wherein a height from an upper surface of the lower storage contact to the upper surface of the storage pad is less than or equal to the height from the upper surface of the cell gate capping pattern to the upper surface of the storage pad.

10. The semiconductor memory device of claim 8, wherein the cell gate capping pattern comprises sidewalls that connect the upper surface of the cell gate capping pattern and the lower surface of the cell gate capping pattern, and wherein the cell gate structure comprises a cell gate insulating layer that extends on a portion of each of the sidewalls of the cell gate capping pattern.

11. The semiconductor memory device of claim 8, further comprising an upper storage contact between the lower storage contact and the storage pad, wherein the upper storage contact comprises a polycrystalline semiconductor material.

12. The semiconductor memory device of claim 8, further comprising a bit line spacer between the fence pattern and the cell gate capping pattern.

13. The semiconductor memory device of claim 8, further comprising a contact silicide layer between the lower storage contact and the storage pad, wherein the contact silicide layer is connected to the lower storage contact and the storage pad.

14. A semiconductor memory device comprising:
a substrate comprising an active area defined by an element isolation layer and that extends in a first direction, wherein the active area comprises a first part and a second part on a plurality of sides of the first part;
a cell gate structure within the substrate and the element isolation layer, wherein the cell gate structure extends in a second direction and is between the first part of the active area and the second part of the active area;
a bit line on the substrate and the element isolation layer, wherein the bit line extends in a third direction and is connected to the first part of the active area;
a cell buffer insulating layer between the bit line and the substrate and comprising an upper cell buffer insulating layer and a lower cell buffer insulating layer;
a lower storage contact on a plurality of sides of the bit line, wherein the lower storage contact is connected to the second part of the active area, and wherein the lower storage contact comprises a semiconductor epitaxial pattern;
a storage pad on the lower storage contact and connected to the lower storage contact;
a contact silicide layer between the lower storage contact and the storage pad; and
a capacitor on the storage pad and connected to the storage pad,
wherein the upper cell buffer insulating layer is between the lower cell buffer insulating layer and the bit line, the cell gate structure comprises a word line and a cell gate capping pattern on the word line, and each of the cell gate capping pattern and the lower cell buffer insulating layer comprises an upper surface, wherein a height from an upper surface of the substrate to an upper surface of the storage pad is greater than a height from the upper surface of the cell gate capping pattern to the upper surface of the storage pad, and wherein the height from the upper surface of the substrate to the upper surface of the storage pad is greater than a height from an upper surface of the lower storage contact to the upper surface of the storage pad.

15. The semiconductor memory device of claim 14, wherein the height from the upper surface of the lower storage contact to the upper surface of the storage pad is less than or equal to a height from the upper surface of the lower cell buffer insulating layer to the upper surface of the storage pad.

16. The semiconductor memory device of claim 14, wherein a height from a lower surface of the lower storage contact to the upper surface of the storage pad is greater than a height from the upper surface of the cell gate capping pattern to the upper surface of the storage pad.

17. The semiconductor memory device of claim 14, further comprising an upper storage contact between the lower storage contact and the storage pad, wherein the upper storage contact comprises a polycrystalline semiconductor material.

18. The semiconductor memory device of claim 14, wherein the contact silicide layer is connected to the lower storage contact and the storage pad.

19. The semiconductor memory device of claim 14, further comprising a fence pattern on the cell gate structure and that is connected to the upper surface of the cell gate capping pattern, wherein the fence pattern is connected to the lower storage contact.

20. The semiconductor memory device of claim 14, wherein the cell gate capping pattern comprises a lower surface opposite the upper surface of the cell gate capping pattern and sidewalls that connect the upper surface of the cell gate capping pattern and the lower surface of the cell gate capping pattern, wherein the cell gate structure comprises a cell gate insulating layer, and wherein the cell gate insulating layer extends on a portion of each of the sidewalls of the cell gate capping pattern.

* * * * *